(12) United States Patent
Yoneyama

(10) Patent No.: US 9,214,897 B2
(45) Date of Patent: Dec. 15, 2015

(54) CONTROL METHOD FOR OSCILLATION CIRCUIT, CIRCUIT FOR OSCILLATION, OSCILLATOR, ELECTRONIC APPARATUS, AND MOVING OBJECT

(71) Applicant: Seiko Epson Corporation, Tokyo (JP)

(72) Inventor: Tsuyoshi Yoneyama, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/453,979

(22) Filed: Aug. 7, 2014

(65) Prior Publication Data
US 2015/0042410 A1 Feb. 12, 2015

(30) Foreign Application Priority Data
Aug. 8, 2013 (JP) ................. 2013-165388

(51) Int. Cl.
*H03B 5/04* (2006.01)
*H03B 5/30* (2006.01)
*H03L 1/02* (2006.01)
*H03B 5/36* (2006.01)

(52) U.S. Cl.
CPC .. *H03B 5/36* (2013.01); *H03B 5/04* (2013.01); *H03B 5/30* (2013.01); *H03L 1/022* (2013.01); *H03L 1/026* (2013.01); *H03B 2201/025* (2013.01); *H03B 2201/0208* (2013.01); *H03B 2201/038* (2013.01)

(58) Field of Classification Search
CPC .......... H03B 5/04; H03B 5/06; H03B 5/1265; H03B 5/129; H03B 5/30; H03B 5/32; H03B 5/36; H03B 5/366; H03B 5/368; H03B 2200/0062; H03B 2200/0082; H03B 2201/038; H03L 1/00; H03L 1/02; H03L 1/022; H03L 1/023; H03L 1/025; H03L 1/026; H03L 1/028; H03L 3/00; H03L 7/14; H03L 2207/08
USPC ......... 331/36 C, 116 FE, 116 M, 116 R, 154, 331/158, 176
See application file for complete search history.

(56) References Cited

U.S. PATENT DOCUMENTS

| | | | | |
|---|---|---|---|---|
| 4,574,255 A | * | 3/1986 | Fujii et al. | 331/25 |
| 5,126,695 A | * | 6/1992 | Abe | 331/46 |
| 5,463,352 A | * | 10/1995 | Chen | 331/1 R |
| 5,719,534 A | * | 2/1998 | Imura | 331/186 |

(Continued)

FOREIGN PATENT DOCUMENTS

| | | |
|---|---|---|
| JP | 2001-311786 A | 11/2001 |
| JP | 2008-118732 A | 5/2008 |

(Continued)

*Primary Examiner* — Levi Gannon
(74) *Attorney, Agent, or Firm* — Harness, Dickey & Pierce, P.L.C.

(57) ABSTRACT

An oscillation circuit includes a temperature compensating section to which electric power is supplied from a main power supply and a backup power supply, an oscillating section, a function of which is compensated by a signal from the temperature compensating section, and a switch and a power-supply monitoring circuit configured to select, when the temperature compensating section is not operating, at least one of the main power supply and the backup power supply and control connection to the temperature compensating section.

18 Claims, 13 Drawing Sheets

(56) References Cited

U.S. PATENT DOCUMENTS

| | | | |
|---|---|---|---|
| 5,889,438 A * | 3/1999 | Yamaguchi | 331/17 |
| 6,617,756 B1 * | 9/2003 | Uchiyama | 310/317 |
| 2005/0206463 A1 * | 9/2005 | Godambe et al. | 331/74 |
| 2006/0214738 A1 * | 9/2006 | Sheng et al. | 331/36 C |
| 2013/0249611 A1 * | 9/2013 | Vandepas | 327/159 |

FOREIGN PATENT DOCUMENTS

| | | |
|---|---|---|
| JP | 2009-131129 A | 6/2009 |
| JP | 2009-188862 A | 8/2009 |
| JP | 2009-219176 A | 9/2009 |

* cited by examiner

CONTROL METHOD FOR OSCILLATION CIRCUIT, CIRCUIT FOR OSCILLATION, OSCILLATOR, ELECTRONIC APPARATUS, AND MOVING OBJECT

BACKGROUND

1. Technical Field

The present invention relates to a control method for an oscillation circuit, a circuit for oscillation, an oscillator, an electronic apparatus, and a moving object.

2. Related Art

A real time clock (RTC) circuit is a circuit including a clocking function and is incorporated in a variety of electronic apparatuses such as a personal computer. In general, the RTC circuit is requested to continue clocking even when a main power supply of an electronic apparatus is disconnected or when main power is not temporarily supplied because of momentary power interruption. JP-A-2009-131129 (Patent Literature 1) discloses a semiconductor device including a backup power supply switching circuit that monitors the voltage of a main power supply, actuates an RTC circuit with a main power supply when the voltage is equal to or higher than a setting voltage, and actuates the RTC circuit with a backup power supply when the voltage is lower than the setting voltage.

However, Patent Literature 1 discloses the technique for monitoring the voltage of the main power supply and switching the use of the main power supply and the use of the backup power supply but does not refer to a relation between an operation state of the RTC circuit and a power supply switching operation. For example, when the power supply switching is performed when the RTC circuit is performing, for example, adjustment of frequency-temperature characteristics of an oscillation circuit section, it is likely that fluctuation of a power supply voltage supplied to the RTC circuit occurs and causes a malfunction in adjustment processing for the frequency temperature characteristics. This problem is not limited to the adjustment processing for the frequency temperature characteristics and is common to a compensating section that performs processing for correcting fluctuation in an oscillation frequency due to some environmental change.

SUMMARY

An advantage of some aspects of the invention is to provide a control method for an oscillation circuit, a circuit for oscillation, an oscillator, an electronic apparatus, and a moving object capable of reducing the likelihood that the compensating section for the oscillation frequency causes a malfunction because of the switching operation for the power supply voltage.

The invention can be implemented as the following forms or application examples.

Application Example 1

This application example of the invention is directed to a circuit for oscillation including: a compensating section to which electric power is supplied from at least one power supply source among a plurality of power supply sources; an oscillating section, a function of which is compensated by a signal from the compensating section; and a power-supply selecting section configured to select, when the compensating section is not operating, at least one of the plurality of power supply sources and perform an operation for controlling connection to the compensating section.

With the circuit for oscillation according to this application example, the compensating section is not affected by a power supply voltage fluctuation involved in the operation of the power-supply selecting section when the compensating section operates. Therefore, it is possible to reduce a malfunction of the compensating section due to the power supply voltage fluctuation. Therefore, it is possible to reduce the likelihood that accuracy of an oscillation frequency of the circuit for oscillation is deteriorated.

Application Example 2

In the circuit for oscillation according to the application example described above, the power-supply selecting section may operate after the operation of the compensating section is set.

With the circuit for oscillation according to this application example, the oscillation frequency of the oscillating section is compensated before the operation of the power-supply switching section is performed. A peripheral circuit or an internal circuit, which operates with the oscillating section as a clock source, can operate at an early stage. It is possible to start the peripheral circuit or the internal circuit at high speed.

Application Example 3

In the circuit for oscillation according to the application example described above, the compensating section may operate after the power-supply selecting section operates.

With the circuit for oscillation according to this application example, it is possible to maintain, in a more stable state, a power supply voltage supplied to the compensating section before the operation of the compensating section is performed. Therefore, it is possible to actuate, in a more stable state, the compensating section that consumes relatively large power during the operation and reduce a malfunction of the compensating section. Therefore, it is possible to configure the circuit for oscillation having high frequency stability.

Application Example 4, Application Example 5, Application Example 6

The circuit for oscillation according to the application example described above may further include a clocking section configured to generate time information on the basis of a signal output from the oscillating section. An operation of the clocking section for updating the time information and an operation of the power-supply selecting section may be prevented from overlapping each other.

With the circuit for oscillation according to these application examples, the power-supply selecting section is not actuated during the operation of the clocking section for updating the time information. Therefore, the clocking section is not affected by power supply voltage fluctuation involved in the operation of the power-supply selecting section when the clocking section updates the time information. Therefore, the likelihood of a malfunction of the clocking section due to the power supply voltage fluctuation decreases. It is possible to reduce the likelihood that, for example, accuracy of the time information generated by the clocking section is deteriorated.

Application Example 7

This application example of the invention is directed to an oscillator including: any one of the circuits for oscillation described above; and a resonator.

Application Example 8

This application example of the invention is directed to an electronic apparatus including any one of the circuits for oscillation described above.

Application Example 9

This application example of the invention is directed to a moving object including any one of the circuits for oscillation described above.

Application Example 10

This application example of the invention is directed to a control method for an oscillation circuit including an oscillating section to which a resonator is connected, a compensating section to which electric power is supplied from a first power supply source and a second power supply source, the compensating section compensating for a function of the oscillating section, and a power-supply switching section configured to control connection of the first power supply source and the compensating section, the control method including actuating the compensating section and the power-supply switching section such that an operation of the compensating section for setting a compensation amount and an operation of the power-supply switching section for controlling the connection do not overlap each other.

For example, a control section included in the oscillation circuit may control the operation of the compensating section for setting the compensation amount and the operation of the power-supply switching section for controlling the connection not to overlap each other.

With the control method for the oscillation circuit according to this application example, the compensating section is not affected by power supply voltage fluctuation involved in the operation of the power-supply switching section when the compensating section performs the operation for setting the compensation amount. Therefore, it is possible to reduce a malfunction of the compensating section due to the power supply voltage fluctuation. Therefore, it is possible to reduce the likelihood that accuracy of an oscillation frequency of the oscillation circuit is deteriorated.

Application Example 11

In the control method for the oscillation circuit according to the application example described above, the operation for controlling the connection may be performed after the operation for setting the compensation amount.

For example, the control section included in the oscillation circuit may control the operation for controlling the connection to be performed after the operation for setting the compensation amount.

With the control method for the oscillation circuit according to this application example, the oscillation frequency of the oscillating section is compensated before the operation of the power-supply switching section is performed. A peripheral circuit or an internal circuit of the oscillation circuit, which operates with the oscillating section as a clock source, can operate at an early stage. It is possible to start the peripheral circuit or the internal circuit at high speed.

Application Example 12

In the control method for the oscillation circuit according to the application example described above, the operation for setting the compensation amount may be performed after the operation for controlling the connection.

For example, the control section included in the oscillation circuit may control the operation for setting the compensation amount to be performed after the operation for controlling the connection.

With the control method for the oscillation circuit according to this application example, it is possible to maintain, in a more stable state, a power supply voltage supplied to the compensating section before the operation for setting the compensation amount is performed. Therefore, it is possible to actuate, in a more stable state, the compensating section that consumes relatively large power during the operation and reduce a malfunction of the compensating section. Therefore, it is possible to configure the oscillation circuit having high frequency stability.

Application Example 13

In the control method for the oscillation circuit according to the application example described above, the oscillation circuit may further include a clocking section configured to generate time information on the basis of a signal output from the oscillating section. An operation of the clocking section for updating the time information and the operation of the power-supply switching section for controlling the connection may be prevented from overlapping each other.

For example, the control section included in the oscillation circuit may control the operation of the clocking section for updating the time information and the operation of the power-supply switching section for controlling the connection not to overlap each other.

With the control method for the oscillation circuit according to this application example, the power-supply switching section is not actuated when the clocking section performs the operation for updating the time information. Therefore, the clocking section is not affected by power supply voltage fluctuation involved in the operation of the power-supply switching section when the clocking section updates the time information. Therefore, the likelihood that the clocking section malfunctions because of the power supply voltage fluctuation decreases. It is possible to reduce the likelihood that, for example, accuracy of the time information generated by the clocking section from being deteriorated.

Application Example 14

In the control method for the oscillation circuit according to the application example described above, the operation for controlling the connection may include an operation for switching, according to a result of comparing the voltage of the first power supply source with a threshold voltage, the power-supply selecting section to a state in which the power-supply selecting section selects the first power supply source or a state in which the power-supply selecting section selects the second power supply source.

For example, the operation for controlling the connection may include an operation for switching the power-supply selecting section from the state in which the power-supply selecting section selects the first power supply source to a state in which the power-supply selecting section does not select the first power supply source and an operation for comparing the voltage of the first power supply source with the threshold voltage and, when the voltage of the first power supply source is equal to or higher than the threshold voltage, switching the power-supply selecting section to the state in which the power-supply selecting section selects the first power supply source.

For example, the operation for controlling the connection may include an operation for comparing the voltage of the first power supply source with the threshold voltage in the state in which the power-supply selecting section does not select the first power supply source and, when the voltage of the first power supply source is equal to or higher than the threshold voltage, switching the power-supply selecting section to the state in which the power-supply selecting section selects the first power supply source. In this case, when the power-supply selecting section is in the state in which the power-supply selecting section selects the first power supply source when the operation of the power-supply switching section starts, the operation of the power-supply switching section may include, before the operation for comparing the voltage of the first power supply source with the threshold voltage, an operation for switching the power-supply selecting section from the state in which the power-supply selecting section selects the first power supply source to the state in which the power-supply selecting section does not select the first power supply source.

With the control method for the oscillation circuit according to this application example, the operation for setting the compensation amount does not overlap the voltage comparing operation and the switching operation in the power-supply switching section. Therefore, it is possible to further stabilize the operation of the compensating section.

Application Example 15

In the control method for the oscillation circuit according to the application example described above, the oscillation circuit may further include a storing section in which compensation data for compensating for the oscillating section is stored. The operation for setting the compensation amount may include at least one of an operation for writing the compensation data in the storing section, an operation for reading out the compensation data from the storing section, and an operation for setting the oscillating section on the basis of the read-out compensation data.

With the control method for the oscillation circuit according to this application example, although the operation for setting the compensation amount includes manipulation of the compensation data, power supply voltage fluctuation involved in the operation of the power-supply switching section does not occur during the manipulation of the compensation data. Therefore, it is possible to reduce the likelihood that the compensation data is damaged.

BRIEF DESCRIPTION OF THE DRAWINGS

The invention will be described with reference to the accompanying drawings, wherein like numbers reference like elements.

DESCRIPTION OF EXEMPLARY EMBODIMENTS

A preferred embodiment of the invention is explained in detail below with reference to the drawings. The embodiment explained below does not unduly limit the contents of the invention described in the appended claims. All components explained below are not always essential constituent elements of the invention.

1. Real Time Clock 1-1. Configuration

Figure 1:
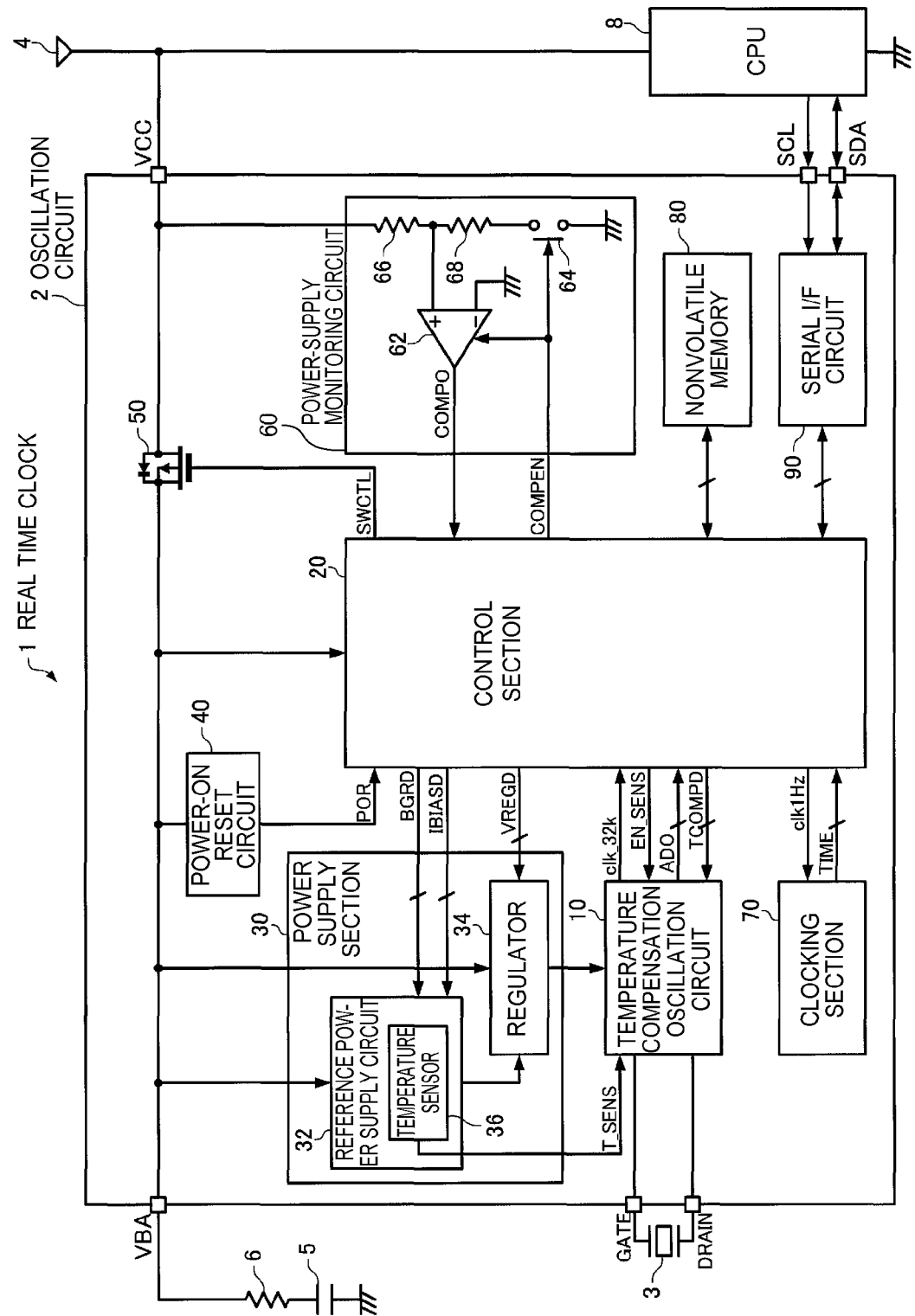
FIG. 1 is a diagram showing a configuration example of a real time clock in an embodiment.

FIG. 1 is a diagram showing a configuration example of a real time clock in this embodiment. A real time clock 1 in this embodiment includes an oscillation circuit 2 that causes a resonator 3 to oscillate. The real time clock 1 in this embodiment may include the resonator 3 or may include a limiting resistor 6 or a backup power supply 5.

In this embodiment, the oscillation circuit 2 is realized by one integrated circuit (IC) chip and includes two power supply terminals, i.e., a VCC terminal and a VBA terminal. However, the oscillation circuit 2 may be realized by wire-connecting a plurality of IC chips or a part or all of components of the oscillation circuit 2 may be realized by wire-connecting discrete components.

A main power supply 4 is connected to the VCC terminal. Electric power is supplied to the VCC terminal from the main power supply 4. A CPU (Central Processing Unit) 8 is connected to the VCC terminal. When the CPU 8 stops operation in order to reduce a consumed current, the power supply from the main power supply 4 to the VCC terminal is interrupted. The oscillation circuit 2 needs to continue a clocking operation even in a state in which the power supply from the main power supply 4 is interrupted. Therefore, a chargeable backup power supply 5 (a secondary battery, a large-capacity capacitor, etc.) is connected to the VBA terminal via the limiting resistor 6 for limiting charging speed. However, the backup power supply 5 may be replaced with an un-chargeable power supply (a primary battery, etc.).

In this embodiment, the oscillation circuit 2 includes a temperature compensation oscillation circuit 10, a control section 20, a power supply section 30, a power-on reset circuit 40, a switch 50, a power-supply monitoring circuit 60, a clocking section 70, a nonvolatile memory 80, and a serial interface (I/F) circuit 90. However, in the oscillation circuit 2, a part of the components may be omitted or changed or other components may be added.

The switch 50 is connected between the VCC terminal and the VBA terminal. In this embodiment, the switch 50 is realized by a PMOS transistor. That is, in the switch 50, an upstream side in a flowing direction of an electric current is a source and a downstream side in the flowing direction is a drain. The switch 50 conducts (turns on) the source and the drain when a control signal SWCTL input to a gate terminal is at a low level and non-conducts (turns off) the source and the drain when the control signal SWCTL is at a high level.

In this embodiment, in the switch 50, the drain is connected to a back gate. Between the source and the drain, a diode (a body diode) having an anode on the source side and a cathode on the drain side (a forward direction of which is a direction from the source to the drain) is formed. Therefore, in the switch 50, an electric current flows in the direction from the source to the drain (the forward direction of the diode) if source potential is higher than drain potential even in an OFF state.

The switch 50 is provided to set the VCC terminal side as the source and set the VBA terminal side as the drain. Therefore, in a state in which a power supply voltage is supplied from the main power supply 4, the voltage at the VBA terminal is the power supply voltage of the main power supply 4 when the switch 50 is on. When the switch 50 is off, the voltage at the VBA terminal is a voltage lower than the power supply voltage of the main power supply 4 by a forward direction drop voltage VF of the diode included in the switch 50. When the switch 50 is on, an electric current flows from the main power supply 4 to the backup power supply 5 through a channel formed between the source and the drain of the switch 50 and the backup power supply 5 is charged. Even when the switch 50 is off, an electric current flows from the main power supply 4 to the backup power supply 5 through the diode of the switch 50 and the backup power supply 5 is charged.

On the other hand, in a state in which the supply of the power supply voltage from the main power supply 4 is interrupted, the voltage at the VBA terminal is the power supply voltage of the backup power supply 5 both when the switch 50 is on and when the switch 50 is off.

The voltage at the VBA terminal is supplied to the sections as an internal power supply voltage of the oscillation circuit 2. The voltage at the VBA terminal is supplied to the power-on reset circuit 40. The power-on reset circuit 40 follows a voltage rise at the VBA terminal and generates a reset signal POR until the voltage reaches a desired voltage. For example, in an uncharged state of the backup power supply 5, when the power supply voltage of the main power supply 4 is supplied to the VCC terminal, the switch 50 is turned on and the backup power supply 5 is charged. At the same time, the voltage at the VBA terminal rises and the reset signal POR is generated.

The power supply section 30 includes a reference power supply circuit 32 and a regulator 34. The power supply section 30 generates, on the basis of the voltage at the VBA terminal, a power supply voltage to be supplied to the temperature compensation oscillation circuit 10.

The reference power supply circuit 32 generates a reference voltage VREF and a reference current IBIAS, which are fixed irrespective of temperature, and supplies the reference voltage VREF and the reference current IBIAS to the regulator 34. In this embodiment, the reference voltage VREF is adjustable in a predetermined range according to reference voltage adjustment data BGRD supplied from the control section 20. Similarly, the reference current IBIAS is adjustable in a predetermined range according to reference current adjustment data IBIASD supplied from the control section 20. In this embodiment, the reference power supply circuit 32 includes a temperature sensor 36 that outputs a temperature detection signal T_SENS. The reference power supply circuit 32 can be realized by, for example, a band gap reference circuit configured by a circuit that generates a predetermined voltage using a band gap voltage of a semiconductor, the temperature sensor 36 that generates a voltage having a temperature characteristic opposite to a temperature characteristic of the band gap voltage, and a circuit that adds up output voltages of these two circuits.

The regulator 34 generates, on the basis of the reference voltage VREF and the reference current IBIAS, a power supply voltage to be supplied to the temperature compensation oscillation circuit 10 and outputs the power supply voltage. In this embodiment, the output voltage of the regulator 34 is adjustable in a predetermined range according to regulator voltage adjustment data VREGD supplied from the control section 20.

The temperature compensation oscillation circuit 10 is a circuit for causing the resonator 3, which is connected via a GATE terminal and a DRAIN terminal of the oscillation circuit 2, to oscillate. The temperature compensation oscillation circuit 10 operates using the output voltage of the regulator 34 as a power supply voltage.

Figure 2:
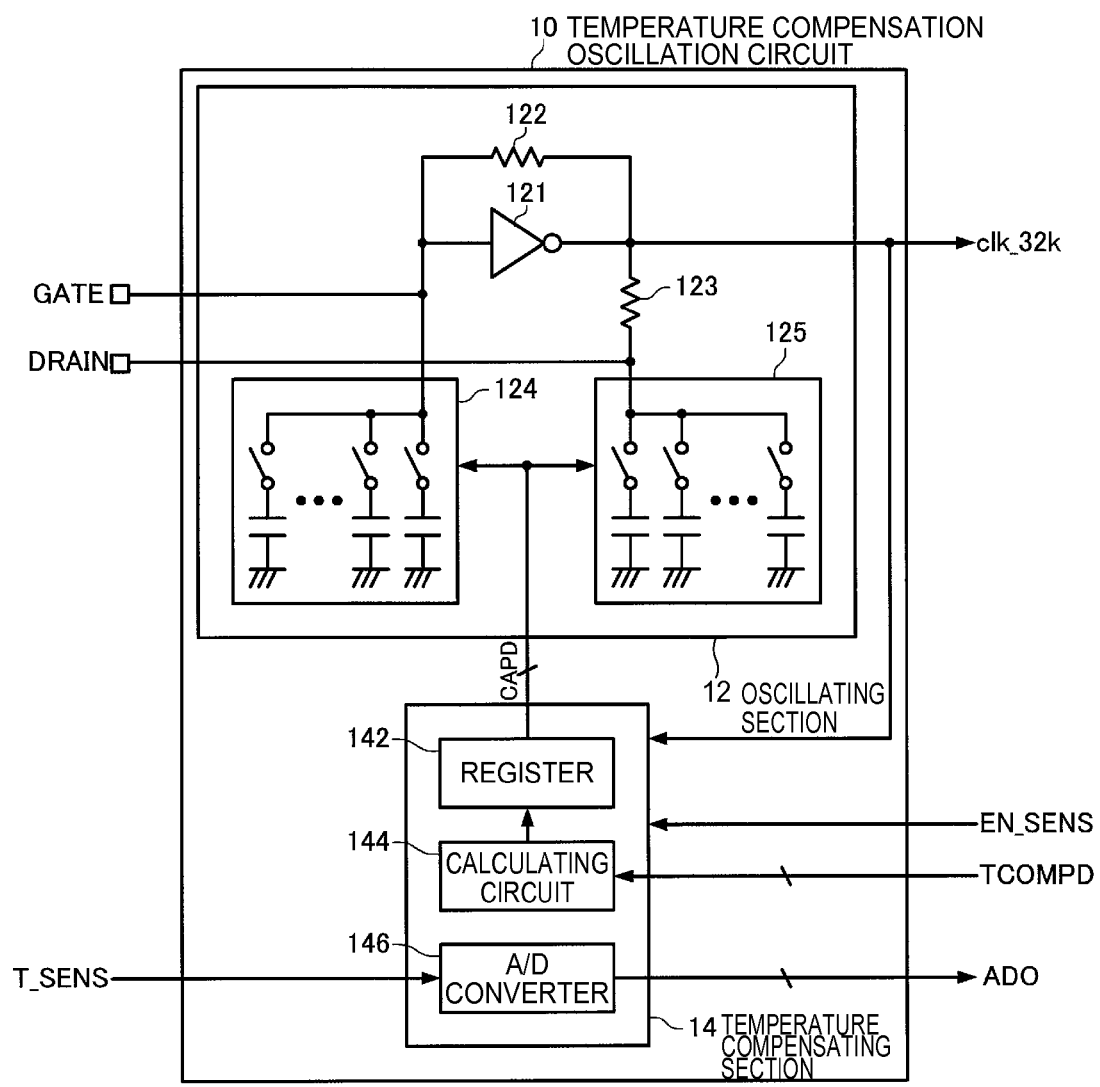
FIG. 2 is a diagram showing a configuration example of a temperature compensation oscillation circuit in the embodiment.

FIG. 2 is a diagram showing a configuration example of the temperature compensation oscillation circuit 10 in this embodiment. As shown in FIG. 2, the temperature compensation oscillation circuit 10 includes an oscillating section 12 and a temperature compensating section 14.

The oscillating section 12 includes an inverter circuit 121, two resistors 122 and 123, and two variable capacitance circuits 124 and 125. An input terminal of the inverter circuit 121 is connected to the GATE terminal of the oscillation circuit 2. An output terminal of the inverter circuit 121 is connected to the DRAIN terminal of the oscillation circuit 2 via the resistor 123.

The resistor 122 is connected between an output terminal and an input terminal of the inverter circuit 121. The resistor 123 is connected between the output terminal of the inverter circuit 121 and the DRAIN terminal.

The variable capacitance circuit 124 includes a plurality of capacitive elements connected between the input terminal of the inverter circuit 121 (the GATE terminal of the oscillation circuit 2) and the ground respectively via a plurality of switches. It is possible to variably set a load capacity of the input terminal of the inverter circuit 121 (the GATE terminal of the oscillation circuit 2) by switching ON and OFF of the plurality of switch elements. Similarly, the variable capacitance circuit 125 includes a plurality of capacitive elements connected between the output terminal of the inverter circuit 121 (the DRAIN terminal of the oscillation circuit 2) and the ground respectively via a plurality of switches. It is possible to variably set a load capacity of the output terminal of the inverter circuit 121 (the DRAIN terminal of the oscillation circuit 2) by switching ON and OFF of the switching elements. One of the variable capacitance circuits 124 and 125 may be replaced with a circuit having a fixed capacitance value.

The temperature compensating section 14 includes a register 142, an arithmetic circuit 144, and an A/D converter 146. The temperature compensating section 14 operates when a control signal EN_SENS from the control section 20 is at a high level. In this embodiment, the control signal EN_SENS changes to the high level for a fixed period at a fixed cycle. The temperature compensating section 14 intermittently operates.

The A/D converter 146 A/D-converts the temperature detection signal T_SENS and outputs A/D-converted data ADO to the control section 20. The arithmetic circuit 144 receives temperature compensation data TCOMPD corresponding to the A/D-converted data ADO from the control section 20, performs a temperature correction calculation to determine an ON/OFF control value (high or low) of the switch elements of the variable capacitance circuits 124 and 125, and sets the ON/OFF control value in the register 142 as capacitance selection data CAPD. ON/OFF of the switching elements of the variable capacitance circuits 124 and 125 is controlled according to the capacitance selection data CAPD.

The temperature compensation oscillation circuit 10 configured as explained above periodically updates the capacitance selection data CAPD according to a temperature change and, while correcting a temperature characteristic of the resonator 3, causes the resonator 3 to oscillate at a desired frequency near a resonance frequency of the resonator 3. In this embodiment, the resonance frequency of the resonator 3 is a frequency near 32.768 kHz. The temperature compensation oscillation circuit 10 outputs a 32.768 kHz clock signal clk_32 k having an extremely small frequency deviation in an operation guarantee temperature range.

As the resonator 3, a quartz crystal resonator of quartz crystal Z cut or using a cut angle formed by rotating a Y axis of the quartz crystal Z cut several times about an X axis, a quartz crystal resonator of SC cut or AT cut, an SAW (Surface Acoustic Wave) resonator, or the like can be used. As the resonator 3, for example, a piezoelectric resonator and an MEMS (Micro Electra Mechanical Systems) resonator other than the quartz crystal resonator can also be used. As a base material of the resonator 3, piezoelectric single crystal such as quartz, lithium tantalate, or lithium niobate, a piezoelectric material such as piezoelectric ceramics such as lead zirconate titanate, a silicon semiconductor material, or the like can be used. As oscillating means of the resonator 3, oscillating means by a piezoelectric effect may be used or electrostatic driving by a Coulomb force may be used. As the shape of the resonator, a planar shape, a tuning fork shape, or the like can be used.

Referring back to FIG. 1, the power-supply monitoring circuit 60 includes a comparator 62, a switch circuit 64, and two resistors 66 and 68.

The switch circuit 64 is turned on when a control signal COMPEN from the control section 20 is at a high level and is turned off when the control signal COMPEN is at the low level.

The two resistors 66 and 68 are connected in series between the VCC terminal and the ground via the switch circuit 64.

The comparator 62 operates when the control signal COMPEN from the control section 20 is at the high level and compares a voltage obtained by dividing the voltage at the VCC terminal using the two resistors 66 and 68 with a predetermined voltage. That is, the comparator 62 determines whether the voltage at the VCC terminal is equal to or higher than or is lower than a desired voltage (a threshold voltage) and outputs the signal COMPO that is at the high level when the voltage at the VCC terminal is equal to or higher than the threshold voltage and is at a low level when the voltage at the VCC terminal is lower than the threshold voltage.

In this embodiment, the control signal COMPEN is at the high level for a fixed period at a fixed cycle. The power-supply monitoring circuit 60 intermittently operates. The switch circuit 64 is turned off when the control signal COMPEN is at the low level. This is for the purpose of preventing an electric current from flowing from the VCC terminal to the ground in a period in which the comparator 62 does not operate and reducing a consumed current.

The clocking section 70 generates time information (information such as year, month, day, hour, minute, and second) in synchronization with a 1 Hz clock signal clk1 Hz. In this embodiment, the clocking section 70 updates the second information at a falling edge (timing of a change from the high level to the low level) of the clock signal clk1 Hz.

The nonvolatile memory 80 stores data for adjustment of the sections of the oscillation circuit 2. The nonvolatile memory 80 can be realized by, for example, a flash memory such as an MONOS (Metal-Oxide-Nitride-Oxide-Silicon) memory or an EEPROM (Electrically Erasable Programmable Read-Only Memory). In this embodiment, reference voltage adjustment data, reference current adjustment data, regulator voltage adjustment data, temperature compensation data, and the like are stored in the nonvolatile memory 80. In an inspection process for each real time clock 1, optimum values of the data may be written in the nonvolatile memory 80.

The serial I/F circuit 90 is an interface circuit for performing data communication between the oscillation circuit 2 and the CPU 8. For example, the serial I/F circuit 90 may perform data communication in a I2C communication system via an SCL terminal and an SDA terminal. Via the serial I/F circuit 90, the CPU 8 can read various data from and write various data in the nonvolatile memory 80 and read out time information generated by the clocking section 70.

The control section 20 is initialized by the reset signal POR and performs, for example, operation control for the temperature compensation oscillation circuit 10, the power supply section 30, and the power-supply monitoring circuit 60, ON/OFF control for the switch 50, reading of various data from and writing of various data in the nonvolatile memory 80, data communication with the outside via the serial I/F circuit 90, and generation of the clock signal clk1 Hz.

Figure 3:
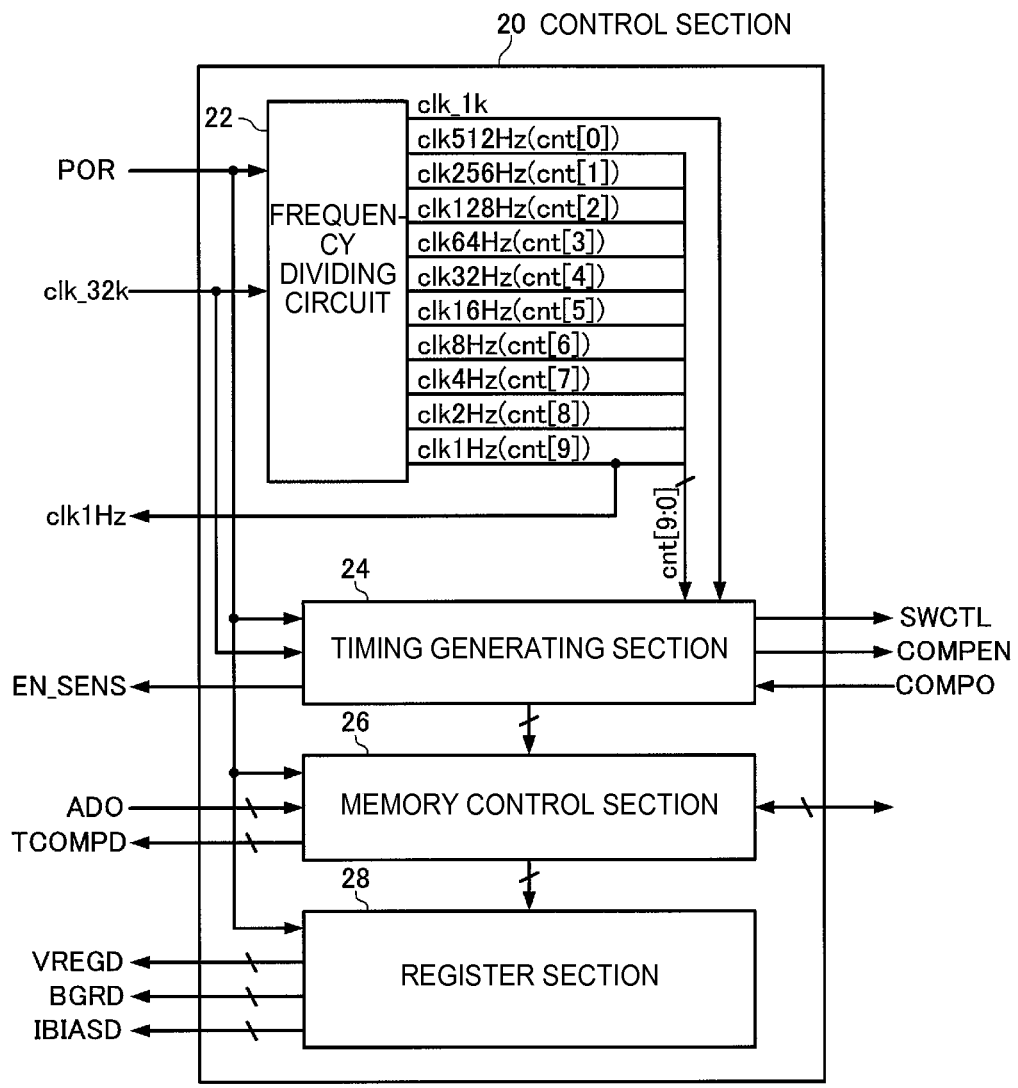
FIG. 3 is a diagram showing a configuration example of a control section in the embodiment.

FIG. 3 is a diagram showing a configuration example of the control section 20 in this embodiment. As shown in FIG. 3, the control section 20 includes a frequency dividing circuit 22, a timing generating section 24, a memory control section 26, and a register section 28. When the reset signal POR is input, all of the sections are initialized.

The register section 28 includes various registers for setting including registers for setting of the reference voltage VREF, the reference current IBIAS, and an output voltage of the regulator 34. When the reset signal POR is generated, the registers for setting are initialized to setting values determined in advance. In particular, in this embodiment, when the reset signal POR is generated, the registers for setting are initialized such that the reference current IBIAS, the reference voltage VREF, and the output voltage of the regulator 34 are larger than usual. In this boost state, electric power supplied to the oscillating section 12 of the temperature compensation oscillation circuit 10 is larger than the electric power in a normal state. Consequently, it is possible to reduce a start time from power-on of the oscillation circuit 2 until the temperature compensation oscillation circuit 10 is stabilized. For example, if the registers for setting of the reference voltage VREF, the reference current IBIAS, and the output voltage of the regulator 34 are respectively initialized to maximums that can be set as the reference voltage VREF, the reference current IBIAS, and the output voltage of the regulator 34, the start time can be minimized.

The frequency dividing circuit 22 generates a 1.024 kHz clock signal clk_1 k obtained by dividing a 32.768 kHz clock signal clk_32 k by 32. Further, the frequency dividing circuit 22 generates a clock signal clk512 Hz, a clock signal clk256 Hz, a clock signal clk128 Hz, a clock signal clk64 Hz, a clock signal clk32 Hz, a clock signal clk16 Hz, a clock signal clk8

Hz, a clock signal clk4 Hz, a clock signal clk2 Hz, and a clock signal clk1 Hz respectively obtained by dividing the clock signal clk_1 k by 21 (=2) to 210 (=1024). The clock signal clk1 Hz is a signal of a 1-second cycle and is an operation clock signal of the clocking section 70.

The ten clock signals clk512 Hz to clk1 Hz excluding the clock signal clk_1 k form a 10-bit count signal cnt[9:0] having clk1 Hz as an MSB and having clk512 Hz as an LSB. That is, the count signal cnt[9:0] is counted up from 0 to 1023 in one second.

When the count signal cnt[9:0] is 0, the timing generating section 24 changes the control signal EN_SENS from the low level to the high level in synchronization with the clock signal clk_32 k. When a predetermined time is counted by the clock signal clk_32 k, the timing generating section 24 returns the control signal EN_SENS to the low level.

When the count signal cnt[9:0] is 64, the timing generating section 24 changes the control signal COMPEN from the low level to the high level at the falling edge of the clock signal clk_1 k. When the predetermined time is counted by the clock signal clk_1 k, the timing generating section 24 returns the control signal COMPEN to the low level.

The timing generating section 24 changes the control signal SWCTL from the low level to the high level at timing when the control signal COMPEN is changed from the low level to the high level. At timing when the control signal COMPEN is returned to the low level, the timing generating section 24 returns the control signal SWCTL to the low level only when the output signal COMPO of the power-supply monitoring circuit 60 is at the high level.

The timing generating section 24 controls the operation of the memory control section 26. The memory control section 26 reads data from and writes data in the nonvolatile memory 80. In particular, in this embodiment, when the predetermined time is counted by the clock signal clk_32 k after the control signal EN_SENS is changed from the low level to the high level, the timing generating section 24 causes the memory control section 26 to perform processing for reading out temperature compensation data corresponding to the A/D-converted data ADO (temperature information) from the nonvolatile memory 80.

When the predetermined time is counted by the clock signal clk_32 k from the release of the reset signal POR and immediately after the control signal EN_SENS is returned to the low level, the timing generating section 24 causes the memory control section 26 to perform processing for reading out the reference voltage adjustment data, the reference current adjustment data, the regulator voltage adjustment data from the nonvolatile memory 80 and setting the data respectively in the registers for setting.

In this embodiment, the oscillation circuit 2 is an example of the "oscillation circuit" or the "circuit for oscillation" according to the invention. The oscillating section 12 is an example of the "oscillating section" according to the invention. The temperature compensating section 14 or a component including the temperature compensating section 14 and a part of the control section 20 (a section that performs processing related to a temperature compensating operation) is an example of the "compensating section" according to the invention. The clocking section 70 is an example of the "clocking section" according to the invention. The nonvolatile memory 80 is an example of the "storing section" according to the invention. The control section 20 is an example of the "control section" according to the invention. The switch 50 or a component including the switch 50 and the power-supply monitoring circuit 60 is an example of the "power-supply switching section" or the "power-supply selecting section" according to the invention. The main power supply 4 and the backup power supply 5 are an example of the "plurality of power supply sources" according to the invention. The main power supply 4 is an example of the "first power supply source" according to the invention. The backup power supply 5 is an example of the "second power supply source" according to the invention. The "temperature compensating operation" is an example of the "operation for setting a compensation amount" according to the invention. The "switch changeover operation" is an example of the "operation for controlling connection of the first power supply source and the compensating section". The temperature compensation data stored in the nonvolatile memory 80 is an example of the "compensation data" according to the invention.

1-2. Processing Procedure of the Control Section

Figure 4:
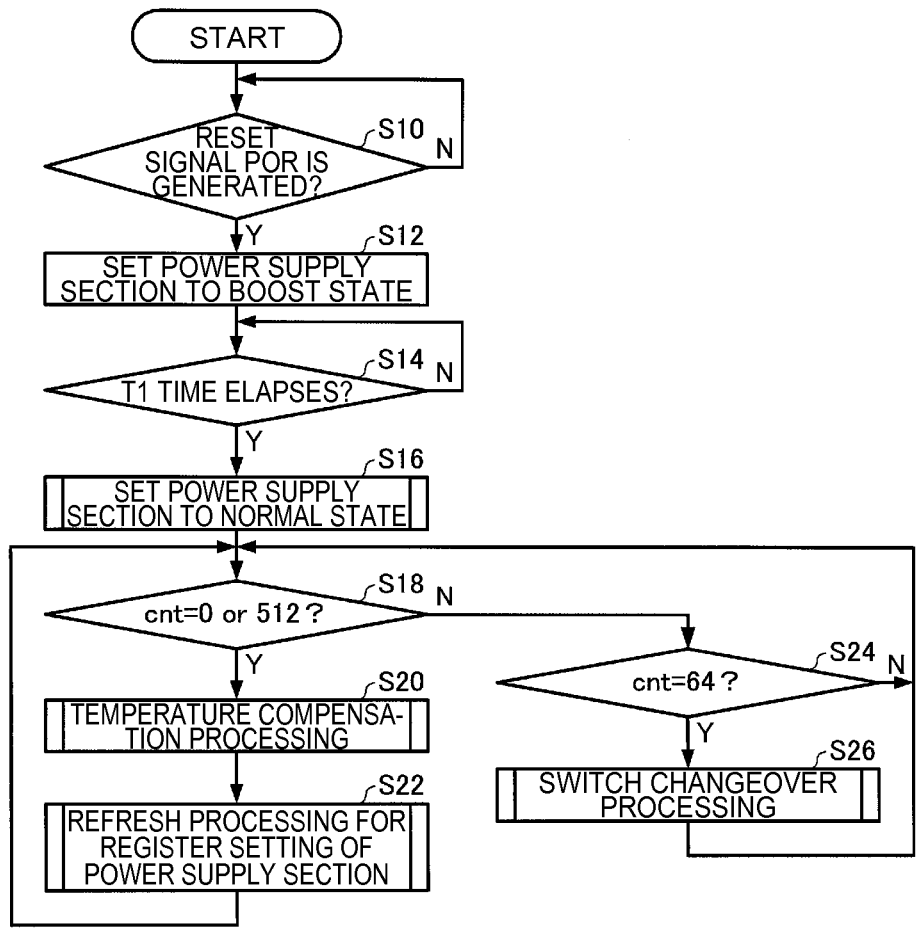
FIG. 4 is a flowchart for explaining an example of a processing procedure of the control section in the embodiment.

FIG. 4 is a flowchart for explaining an example of a processing procedure of the control section 20 in this embodiment. As shown in FIG. 4, in this embodiment, when the reset signal POR is generated (Y in S10), the control section 20 sets the power supply section 30 to the boost state (S12).

Subsequently, when a T1 time elapses after the reset signal POR is released (Y in S14), the control section 20 sets the power supply section 30 to the normal state (S16). The T1 time is set to time equal to or longer than time necessary for an output signal of the temperature compensation oscillation circuit 10 to stabilize.

Thereafter, when the count signal cnt[9:0] is 0 or 512 (Y in S18), the control section 20 performs temperature compensation processing (S20). After the temperature compensation processing ends, the control section 20 performs refresh processing for register setting of the power supply section 30 (S22). That is, in this embodiment, the control section 20 repeatedly performs the temperature compensation processing and the refresh processing at a 0.5-second cycle.

When the count signal cnt[9:0] is 64 (Y in S24), the control section 20 performs switch changeover processing (S26). That is, in this embodiment, the control section 20 repeatedly performs the switch changeover processing at a 1-second cycle.

Figure 5:
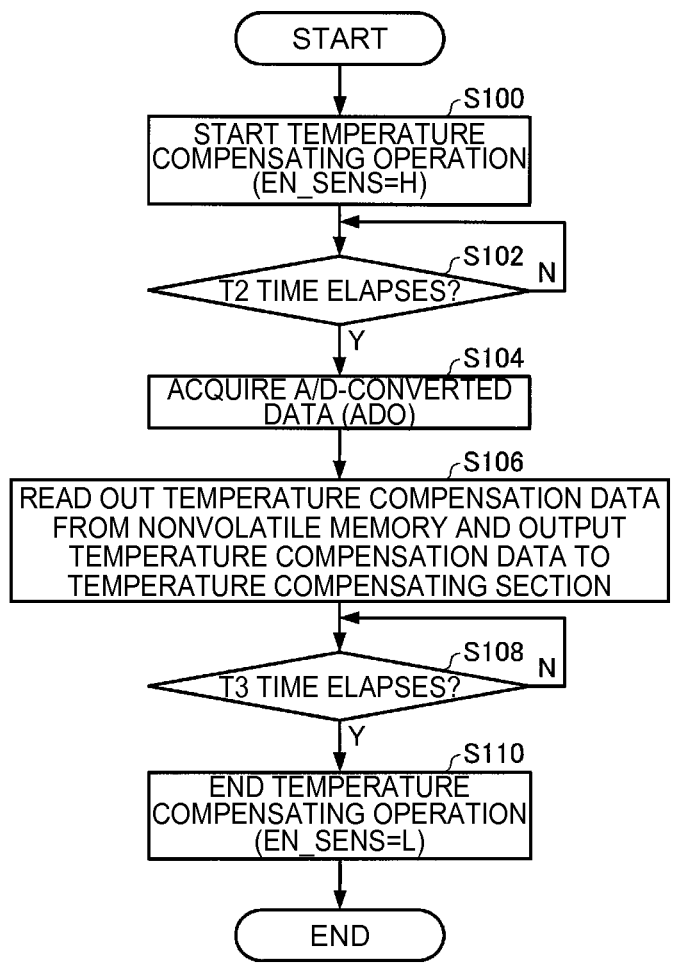
FIG. 5 is a flowchart for explaining an example of a procedure of temperature compensation processing.

FIG. 5 is a flowchart for explaining an example of a procedure of the temperature compensation processing (S20) in FIG. 4. As shown in FIG. 5, first, the control section 20 sets the control signal EN_SENS to the high level and causes the temperature compensating section 14 to start the temperature compensating operation (S100).

When a T2 time elapses after the start of the temperature compensating operation (Y in S102), the control section 20 acquires the A/D-converted data ADO from the temperature compensating section 14 (S104). The T2 time is set to time equal to or longer than time necessary for an A/D conversion operation of the temperature compensating section 14.

The control section 20 reads out temperature compensation data corresponding to the A/D-converted data ADO from the nonvolatile memory 80 and outputs the temperature compensation data to the temperature compensating section 14 as temperature compensation data TCOMPD (S106).

Finally, when a T3 time elapses after the start of the temperature compensating operation (Y in S108), the control section 20 sets the control signal EN_SENS to low level, causes the temperature compensating section 14 to end the temperature compensating operation (S110), and ends the temperature compensation processing. The T3 time is set to time equal to or longer than time necessary for the temperature compensating operation of the temperature compensating section 14 to be completed.

Figure 6:
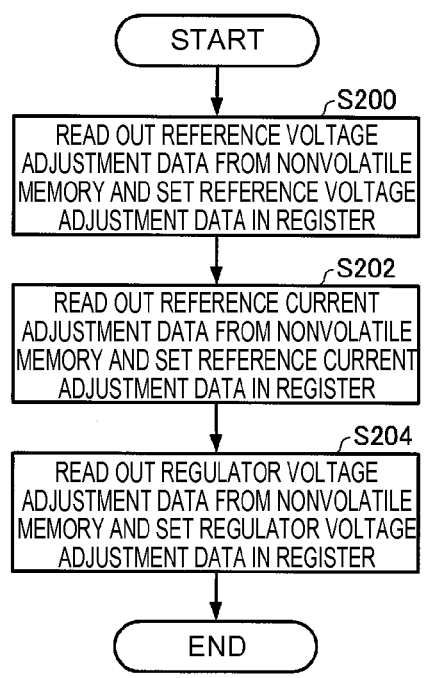
FIG. 6 is a flowchart for explaining an example of a procedure of refresh processing.

FIG. 6 is a flowchart for explaining an example of a procedure of the refresh processing (S22) in FIG. 4. A procedure of the processing for setting the power supply section 30 to the normal state (S16) in FIG. 4 is the same as the procedure shown in FIG. 6.

As shown in FIG. 6, first, the control section 20 reads out the reference voltage adjustment data from the nonvolatile memory 80 and sets the reference voltage adjustment data in a register of the register section 28 (S200).

Subsequently, the control section 20 reads out the reference current adjustment data from the nonvolatile memory 80 and sets the reference current adjustment data in the register of the register section 28 (S202).

Finally, the control section 20 reads out the regulator voltage adjustment data from the nonvolatile memory 80, sets the regulator voltage adjustment data in the register of the register section 28 (S204), and ends the refresh processing.

Figure 7:
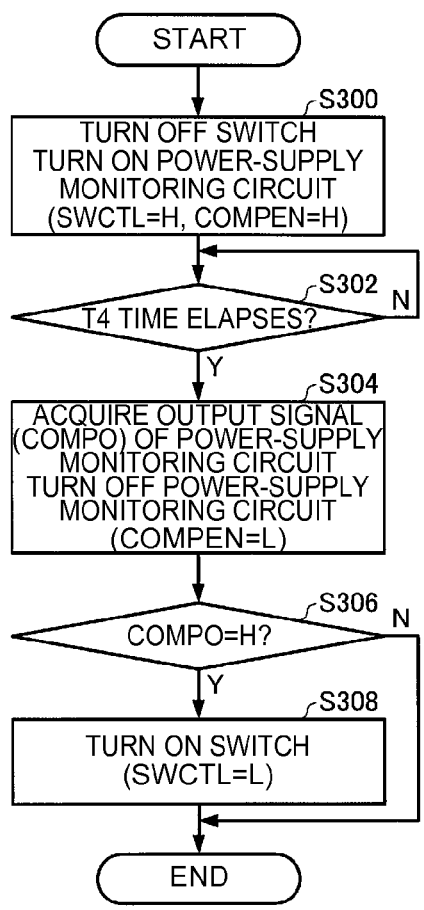
FIG. 7 is a flowchart for explaining an example of a procedure of switch changeover processing.

FIG. 7 is a flowchart for explaining an example of a procedure of the switch changeover processing (S26) in FIG. 4. As shown in FIG. 7, first, the control section 20 sets the control signal SWCTL to the high level to turn off the switch 50 and sets the control signal COMPEN to the high level to turn on the power-supply monitoring circuit 60 (S300). The control section 20 turns off the switch 50 in order to disconnect the VCC terminal from the VBA terminal such that the power-supply monitoring circuit 60 can correctly determine the voltage at the VCC terminal.

When a T4 time elapses after the switch 50 is turned on and the power-supply monitoring circuit 60 is turned on (Y in S302), the control section 20 acquires the output signal COMPO of the power-supply monitoring circuit 60 and sets the control signal COMPEN to the low level to turn off the power-supply monitoring circuit 60 (S304). The T4 time is set to time equal to or longer than time necessary for the output signal COMPO of the power-supply monitoring circuit 60 to stabilize.

When the COMPO is at the high level (Y in S306), the control section 20 returns the control signal SWCTL to the low level and turns on the switch 50. When the COMPO is at the low level (N at S306), the control section 20 keeps the switch 50 off without returning the control signal SWCTL to the low level and ends the switch changeover processing.

1-3. Operation Timing

Figure 8:
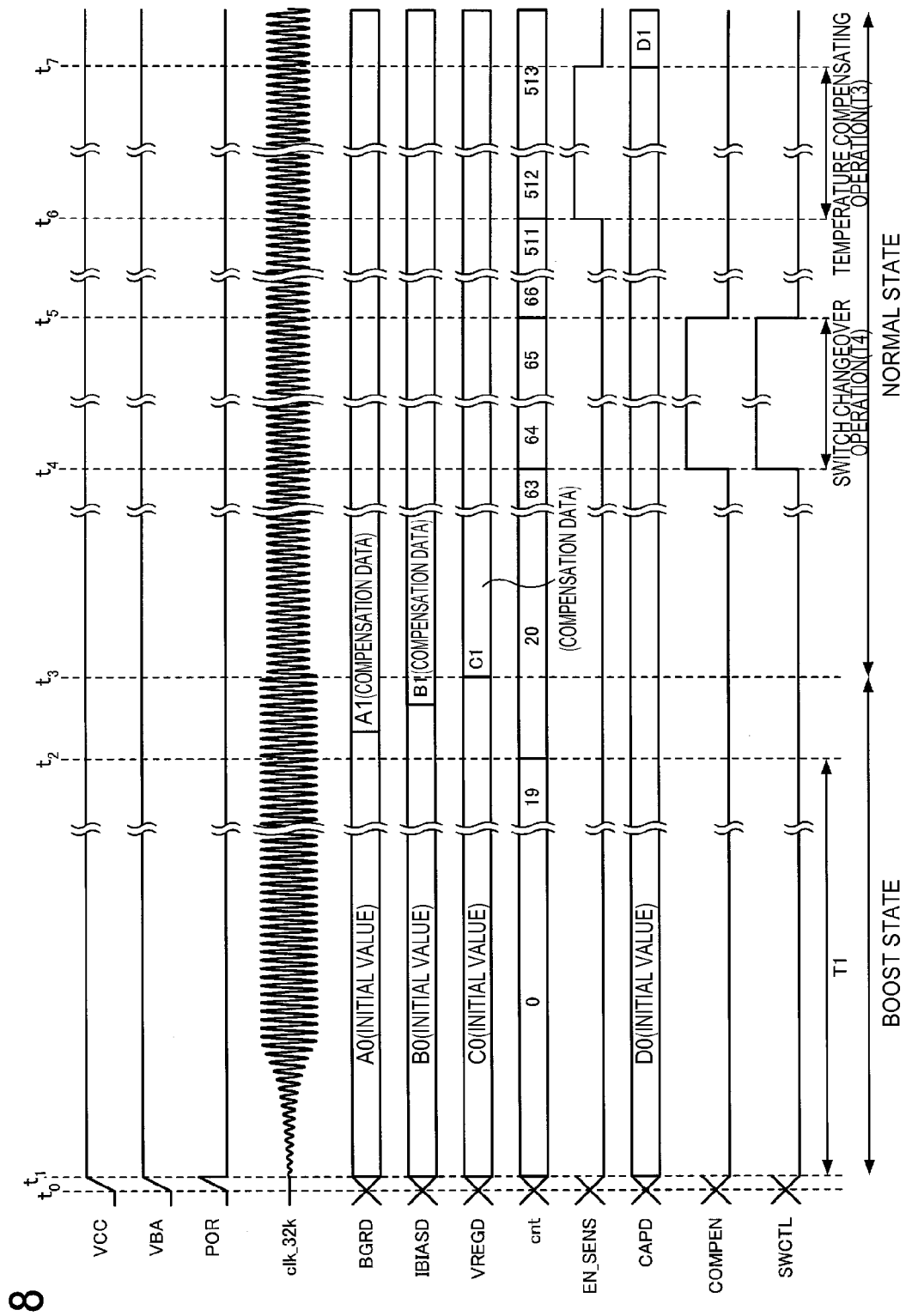
FIG. 8 is a timing chart for explaining an example of an operation during the start of an oscillation circuit.

FIG. 8 is a timing chart showing an example of the operation during startup of the oscillation circuit 2. As shown in FIG. 8, before time t0, the power supply from the main power supply 4 to the VCC terminal is interrupted, the backup power supply 5 is in the uncharged state, and both of the voltage at the VCC terminal and the voltage at the VBA terminal are 0 V.

At time t0, the main power supply 4 is connected to the VCC terminal. At time t1, the voltage at the VCC terminal reaches the power supply voltage of the main power supply 4. At time t0 to t1, the reset signal POR is generated and the registers for setting of the register section 28 are initialized. Consequently, the reference voltage adjustment data BGRD, the reference current adjustment data IBIASD, and the regulator voltage adjustment data VREGD are respectively set to A0, B0, and C0. The power supply section 30 changes to the boost state.

Subsequently, the oscillating section 12 of the temperature compensation oscillation circuit 10 starts an operation. When the clock signal clk_32k is generated, a count-up operation of the count signal cnt[9:0] starts.

At time t2 to t3 after the elapse of the T1 time from time t1, processing for setting the power supply section 30 in the normal state is performed. At time t3, the reference voltage adjustment data BGRD, the reference current adjustment data IBIASD, and the regulator voltage adjustment data VREGD are respectively set to A1, B1, and C1. The power supply section 30 changes to the normal state.

At time t4 when the count signal cnt[9:0] changes to 64 to time t5 after the elapse of the T4 time from time t4, both of the control signal COMPEN and the control signal SWCTL change to the high level and the switch changeover operation is performed. Since the voltage at the VCC terminal is equal to or higher than the threshold voltage, at time t5, the control signal SWCTL returns to the low level.

At time t6 when the count signal cnt[9:0] changes to 512 to time t7 after the elapse of the T3 time from time t6, the control signal EN_SENS changes to the high level and the temperature compensating operation is performed. At time t7, the capacitance selection data CAPD is updated.

In this way, in this embodiment, after the power supply section 30 changes from the boost state to the normal state, the switch changeover operation and the temperature compensating operation are started.

Figure 9:
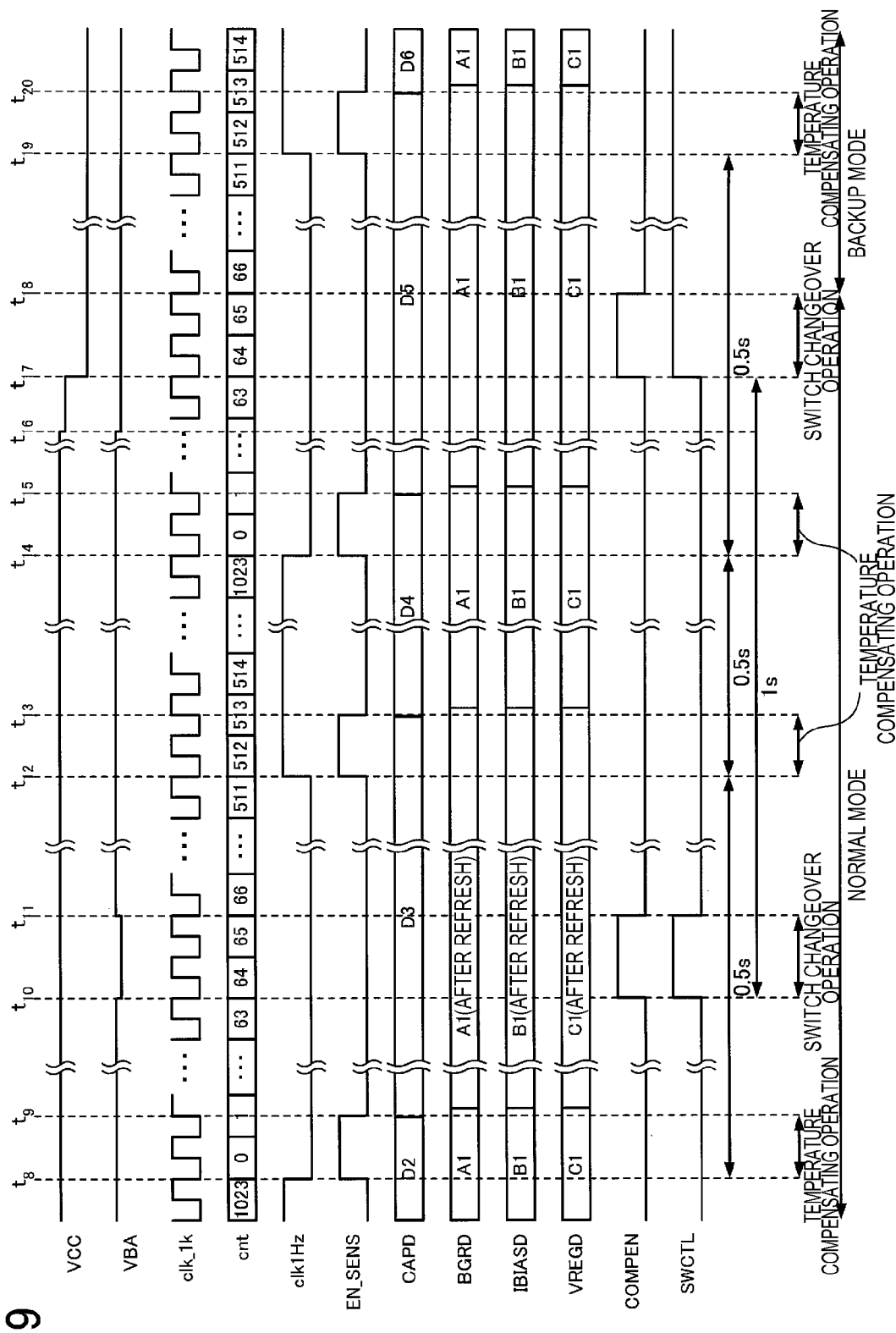
FIG. 9 is a timing chart for explaining an example of an operation after the start of the oscillation circuit.

FIG. 9 is a timing chart for explaining an example of the operation of the oscillation circuit 2 after the completion of charging of the backup power supply 5. In FIG. 9, it is assumed that the power supply voltage of the backup power supply 5 is slightly lower than the power supply voltage of the main power supply 4. As shown in FIG. 9, when the count signal cnt[9:0] changes to 0 at time t8, at time t8 to t9, the control signal EN_SENS changes to the high level and the temperature compensating operation is performed. At time t9, the capacitance selection data CAPD is updated from D2 to D3.

Subsequently, immediately after time t9, a refresh operation for the adjustment data of the power supply section 30 is performed. The register setting values of the reference voltage adjustment data BGRD, the reference current adjustment data IBIASD, and the regulator voltage adjustment data VREGD are respectively refreshed to (overwritten on) A1, B1, and C1.

When the count signal cnt[9:0] changes to 64 at time t10, at time t10 to t11, both of the control signal COMPEN and the control signal SWCTL change to the high level and the switch changeover operation is performed. At time t10 to t11, the switch 50 is turned off. Therefore, the voltage at the VBA terminal changes to the power supply voltage of the backup power supply 5.

Since the voltage at the VCC terminal is equal to or higher than the threshold voltage, at time t11, the control signal SWCTL returns to the low level and the switch 50 is turned on. Therefore, the voltage at the VBA terminal returns to the voltage at the VCC terminal (the power supply voltage of the main power supply 4).

When the count signal cnt [9:0] changes to 512 at time t12, at time t12 to t13, the control signal EN_SENS changes to the high level and the temperature compensating operation is performed. At time t13, the capacitance selection data CAPD is updated from D3 to D4.

Immediately after time t13, the refresh operation for the adjustment data of the power supply section 30 is performed. The register setting values of the reference voltage adjustment data BGRD, the reference current adjustment data IBIASD, the regulator voltage adjustment data VREGD are respectively refreshed to (overwritten on) the A1, B1, and C1.

When the count signal cnt [9:0] changes to 0 at time t14, at time t14 to t15, the control signal EN_SENS changes to the high level and the temperature compensating operation is performed. At time t15, the capacitance selection data CAPD is updated from D4 to D5.

Immediately after time t15, the refresh operation for the adjustment data of the power supply section 30 is performed.

The register setting values of the reference voltage adjustment data BGRD, the reference current adjustment data IBIASD, the regulator voltage adjustment data VREGD are respectively refreshed to (overwritten on) the A1, B1, and C1.

At time t16, the power supply from the main power supply 4 to the VCC terminal is interrupted and the switch 50 is on. Therefore, both of the voltage at the VBA terminal and the voltage at the VCC terminal change to the power supply voltage of the backup power supply 5.

When the count signal cnt[9:0] changes to 64 at time t17, at time t17 to t18, both of the control signal COMPEN and the control signal SWCTL change to the high level and the switch changeover operation is performed. At time t17 to t18, since the switch 50 is turned off, the voltage at the VCC terminal changes to 0 V.

Since the voltage at the VCC terminal is lower than the threshold voltage, at time t18, the control signal SWCTL remains at the high level and does not return to the low level. The switch 50 is kept off. That is, at time t18, the oscillation circuit 2 is switched from a normal mode (a mode in which the oscillation circuit 2 operates with the electric power of the main power supply 4) to a backup mode (a mode in which the oscillation circuit 2 operates with the electric power of the backup power supply 5).

When the count signal cnt[9:0] changes to 512 at time t19, at time t19 to t20, the control signal EN_SENS changes to the high level and the temperature compensating operation is performed. At time t20, the capacitance selection data CAPD is updated from D5 to D6.

Immediately after time t19, the refresh operation for the adjustment data of the power supply section 30 is performed. The register setting values of the reference voltage adjustment data BGRD, the reference current adjustment data IBIASD, and the regulator voltage adjustment data VREGD are respectively refreshed to (overwritten on) A1, B1, and C1.

In this way, in this embodiment, the temperature compensating operation is repeated at a 0.5-second cycle and the switch changeover operation is repeated at a 1-second cycle.

Figure 10:
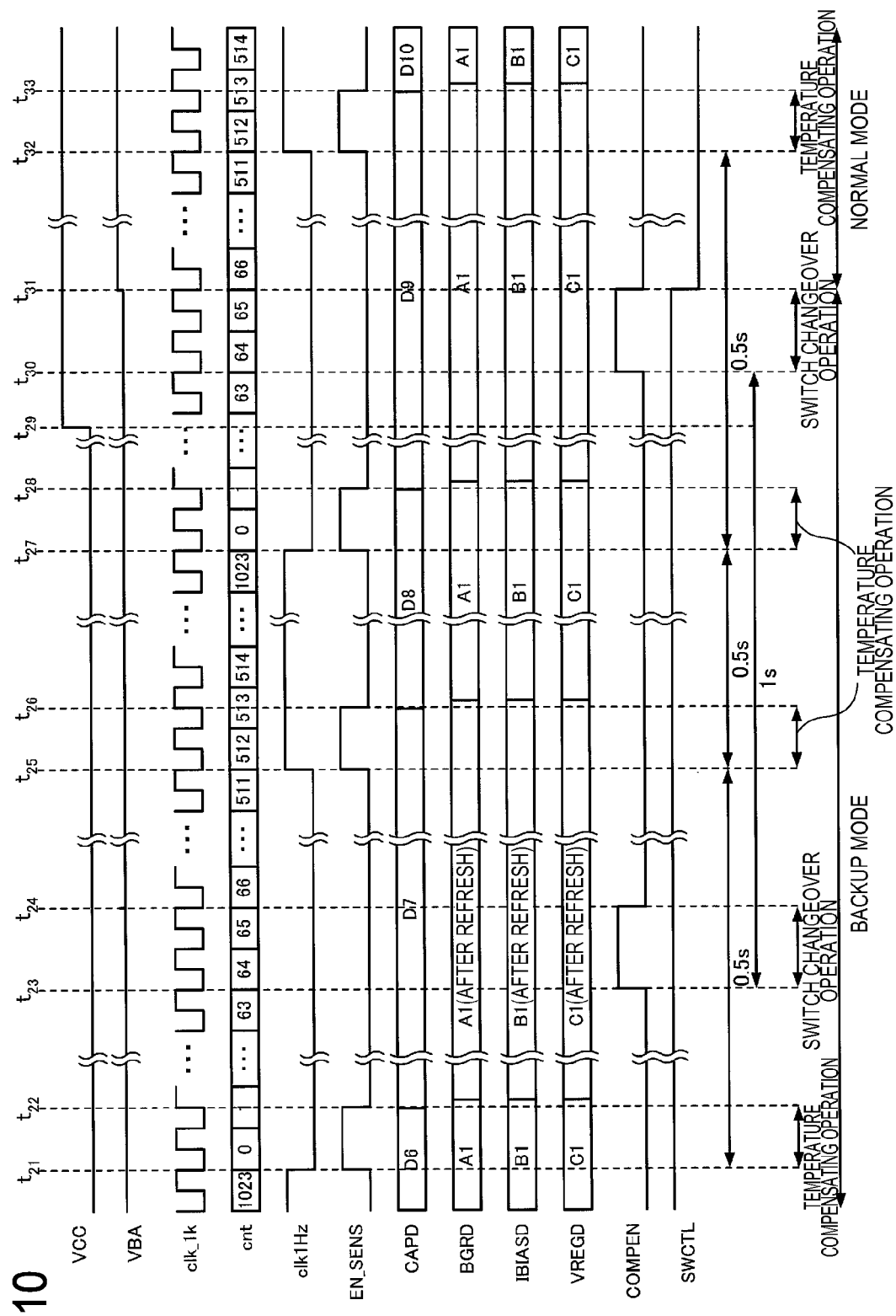
FIG. 10 is a timing chart for explaining another example of the operation after the start of the oscillation circuit.

FIG. 10 is a timing chart for explaining an example of the operation of the oscillation circuit 2 after time t20 in FIG. 9. As shown in FIG. 10, at time t21, the oscillation circuit 2 is in the backup mode and the control signal SWCTL is at the high level. Therefore, the voltage at the VBA terminal is the power supply voltage of the backup power supply 5.

When the count signal cnt[9:0] changes to 0 at time t21, at time t21 to t22, the control signal EN_SENS changes to the high level and the temperature compensating operation is performed. At time t22, the capacitance selection data CAPD is updated from D6 to D7.

Subsequently, immediately after time t22, the refresh operation for the adjustment data of the power supply section 30 is performed. The register setting values of the reference voltage adjustment data BGRD, the reference current adjustment data IBIASD, and the regulator voltage adjustment data VREGD are respectively refreshed to (overwritten on) A1, B1, and C1.

When the count signal cnt[9:0] changes to 64 at time t23, at time t23 to t24, the control signal COMPEN changes to the high level and the switch changeover operation is performed. Since the voltage at the VCC terminal is lower than the threshold voltage, at time t23, the control signal SWCTL remains at the high level and the switch 50 is kept off.

When the count signal cnt[9:0] changes to 512 at time t25, at time t25 to t26, the control signal EN_SENS changes to the high level and the temperature compensating operation is performed. At time t26, the capacitance selection data CAPD is updated from D7 to D8.

Immediately after time t26, the refresh operation for the adjustment data of the power supply section 30 is performed. The register setting values of the reference voltage adjustment data BGRD, the reference current adjustment data IBIASD, and the regulator voltage adjustment data VREGD are respectively refreshed to (overwritten on) A1, B1, and C1.

When the count signal cnt[9:0] changes to 0 at time t27, at time t27 to t28, the control signal EN_SENS changes to the high level and the temperature compensating operation is performed. At time t28, the capacitance selection data CAPD is updated from D8 to D9.

Immediately after time t28, the refresh operation for the adjustment data of the power supply section 30 is performed. The register setting values of the reference voltage adjustment data BGRD, the reference current adjustment data IBIASD, and the regulator voltage adjustment data VREGD are respectively refreshed to (overwritten on) A1, B1, and C1.

At time t29, the power supply from the main power supply 4 to the VCC terminal is resumed. However, since the switch 50 is off, the voltage at the VBA terminal remains at the power supply voltage of the backup power supply 5.

When the count signal cnt[9:0] changes to 64 at time t30, at time t30 to t31, the control signal COMPEN changes to the high level and the switch changeover operation is performed. Since the voltage at the VCC terminal is equal to or higher than the threshold voltage, at time t31, the control signal SWCTL changes to the low level and the switch 50 is turned on. Consequently, the voltage at the VBA terminal changes to the power supply voltage of the main power supply 4. That is, at time t31, the oscillation circuit 2 is switched from the backup mode to the normal mode.

When the count signal cnt[9:0] changes to 512 at time t32, at time t32 to t33, the control signal EN_SENS changes to the high level and the temperature compensating operation is performed. At time t33, the capacitance selection data CAPD is updated from D9 to D10.

Immediately after time t33, the refresh operation for the adjustment data of the power supply section 30 is performed. The register setting values of the reference voltage adjustment data BGRD, the reference current adjustment data IBIASD, and the regulator voltage adjustment data VREGD are respectively refreshed to (overwritten on) A1, B1, and C1.

Figure 11:
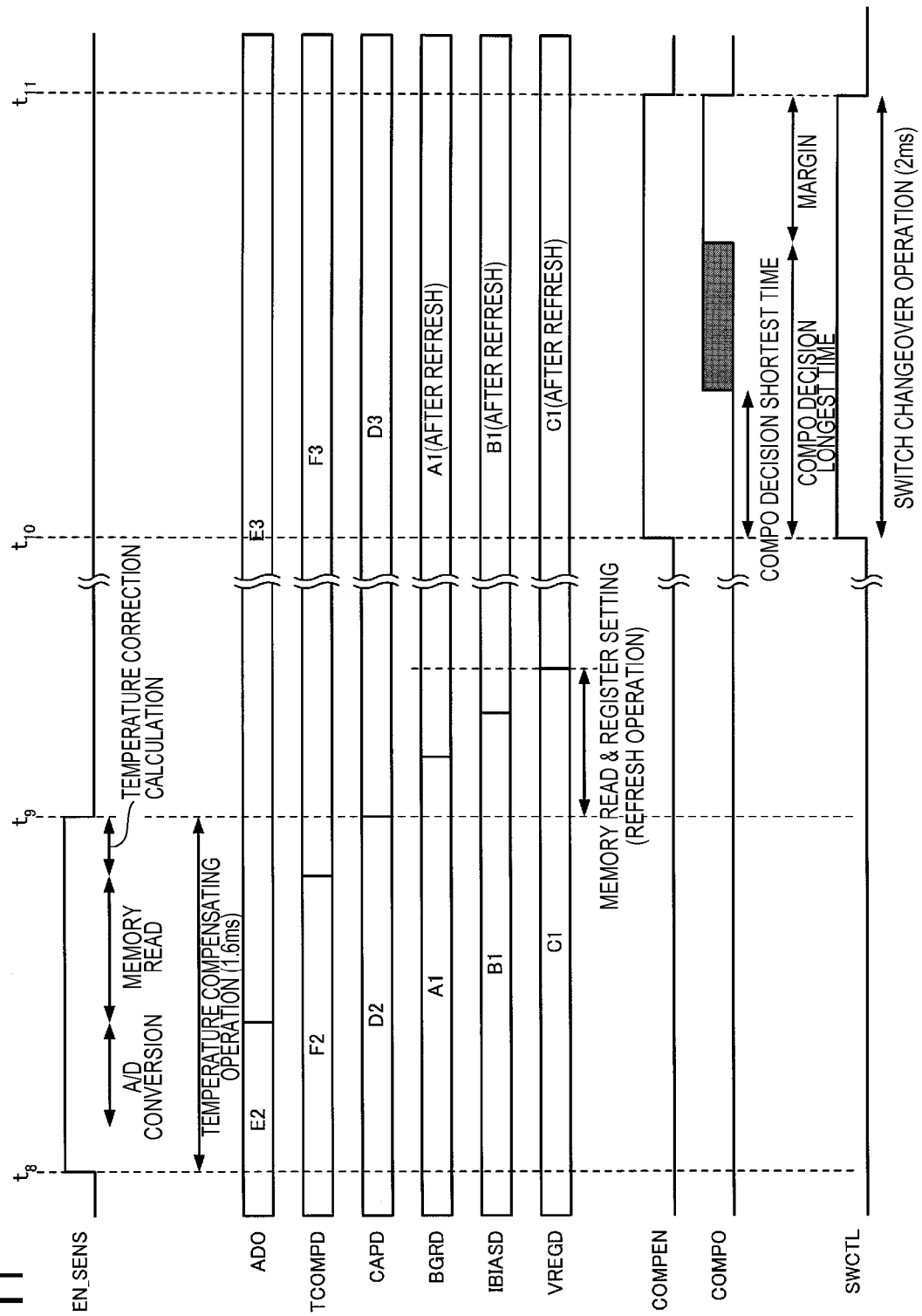
FIG. 11 is a detailed timing chart of a temperature compensating operation and a switch changeover operation.

FIG. 11 is a timing chart for explaining detailed timings of the temperature compensating operation and the switch changeover operation. FIG. 11 corresponds to a period of time t8 to t11 in FIG. 9.

As shown in FIG. 11, when the control signal EN_SENS changes to the high level at time t8, the temperature compensating operation is started. First, A/D conversion of the temperature detection signal T_SENS is performed after a predetermined time and A/D converted data ADO is updated. Subsequently, memory read from the nonvolatile memory 80 is performed. The temperature compensation data TCOMPD is updated from F2 to F3 according to the A/D-converted data ADO. Subsequently, the temperature correction calculation corresponding to the temperature compensation data TCOMPD is performed. At time t9, the capacitance selection data CAPD is updated from D2 to D3, the control signal EN_SENS changes to the low level, and the temperature compensating operation ends. In this way, in this embodiment, the temperature compensating operation includes an A/D conversion operation, a memory read operation, and a temperature correction calculation operation.

At time t9, the refresh operation for the adjustment data of the power supply section 30 is started. Memory read from the nonvolatile memory 80 is performed. The register setting values of the reference voltage adjustment data BGRD, the reference current adjustment data IBIASD, and the regulator voltage adjustment data VREGD are refreshed (overwritten) in order. In this way, in this embodiment, the refresh operation includes the memory read operation and a register setting operation.

When both of the control signal COMPEN and the control signal SWCTL change to the high level at time t10, the switch changeover operation is started, the switch 50 is changed over from ON to OFF, the comparison of the voltage at the VCC terminal and the threshold voltage by the comparator 62 is performed.

At time t11 when time sufficient for deciding the output signal COMPO of the comparator 62 elapses, according to whether the COMPO is at the high level or the low level, it is selected whether the control signal STWL is returned to the low level (the switch 50 is returned to ON). Since the COMPO is at the high level, the control signal STWL returns to the low level and the switch 50 is changed over from OFF to ON. At time t11, the control signal COMPEN changes to the low level, the switch changeover operation ends, and the COMPO returns to the low level. In this way, in this embodiment, the switch changeover operation includes an operation for comparing the voltage at the VCC terminal and the threshold voltage and an operation for selecting ON/OFF of the switch 50 according to a comparison result.

In this embodiment explained above, the temperature compensating operation is performed in synchronization with the maximum frequency of 32.768 kHz. Therefore, a consumed current is extremely large. When timing when the power supply voltage of the temperature compensation oscillation circuit (the temperature compensating section 14) fluctuates according to the switch changeover operation (time t10, t11, and t17 in FIG. 9, time t31 in FIG. 10, etc.) overlaps a temperature compensating operation period, it is likely that an error occurs in the temperature compensating operation because, for example, the temperature compensation data TCOMPD is damaged. Therefore, in the embodiment, as shown in FIGS. 8 to 11, a period of the temperature compensating operation and a period of the switch changeover operation do not overlap. That is, according to this embodiment, since the switch 50 and the power-supply monitoring circuit 60 are not actuated when the temperature compensating section 14 operates, the operation of the temperature compensating section 14 is not affected by power supply voltage fluctuation involved in the operation of the switch 50 and the power-supply monitoring circuit 60. Therefore, it is possible to reduce a malfunction of the temperature compensating section 14 due to the power supply voltage fluctuation. It is possible to reduce the likelihood that, for example, accuracy of an output frequency of the temperature compensation oscillation circuit 10 is deteriorated.

In this embodiment, after the power-on of the oscillation circuit 2, the switch changeover operation is started when the count signal cnt[9:0] changes to 64. Thereafter, the temperature compensating operation is started when the count signal cnt[9:0] changes to 512. Therefore, after the start of the oscillation circuit 2, after the switch changeover operation is performed first, the temperature compensating operation is performed. Therefore, according to this embodiment, it is possible to maintain, in a more stable state, the power supply voltage supplied to the temperature compensating section 14 before the operation of the temperature compensating section 14. Therefore, it is possible to actuate, in a more stable state, the temperature compensating section 14 that consumes large electric power during the operation. It is possible to reduce a malfunction of the temperature compensating section 14. Therefore, it is possible to configure the oscillation circuit 2 with high frequency stability.

In this embodiment, at the timing when the clocking section 70 updates the time information (at the falling edge of 1 Hz clock), since the circuits operate most, a through-current from the power supply to the ground is maximized. When the power supply is switched at this point, it is likely that the clocking section 70 or a circuit that shares the power supply with the clocking section 70 causes a malfunction. Therefore, in this embodiment, the switch changeover operation is not performed when the clocking section operates (time t8 and t14 in FIG. 9, time t21 and t27 in FIG. 10, etc.). Therefore, according to this embodiment, the clocking section 70 is not affected by power supply voltage fluctuation involved in the switch changeover operation when the clocking section 70 operates. Consequently, it is possible to reduce the likelihood that a malfunction of clocking due to power supply voltage fluctuation is caused. Therefore, it is possible to reduce the likelihood that, for example, accuracy of time information output from the clocking section 70 is deteriorated.

In this embodiment, the temperature compensating operation is performed in synchronization with the maximum frequency of 32.768 kHz. Therefore, a consumed current is extremely large. When the temperature compensating operation overlaps timing when the power supply section 30 is switched from the boost state in which a power consumption is also extremely large or the boost state in which the power supply voltage fluctuates to the normal state, it is likely that an error occurs in the temperature compensating operation because, for example, the temperature compensation data TCOMPD is damaged. Therefore, in this embodiment, the temperature compensating operation is started after the power supply section 30 changes from the boost state to the normal state. Consequently, according to this embodiment, it is possible to reduce the likelihood that the temperature compensating operation is wrong. Therefore, it is possible to reduce the likelihood that, for example, accuracy of the output frequency of the temperature compensation oscillation circuit 10 is deteriorated.

In this embodiment, the refresh operation is performed after the temperature compensating operation. The temperature compensating operation and the refresh operation do not overlap each other in terms of time. Therefore, power supply voltage fluctuation that occurs in the refresh operation does not affect the temperature compensating operation. It is possible to reduce a malfunction of the temperature compensating section 14 due to the power supply voltage fluctuation. It is possible to reduce the likelihood that, for example, accuracy of the output frequency of the temperature compensation oscillation circuit 10 is deteriorated. The adjustment data of the power supply section 30 stored in the nonvolatile memory is periodically read out and set in the registers for setting of the register section 28. Therefore, even if the data of the registers for setting is damaged, it is possible to surely recover the data.

2. Oscillator

Figure 12:
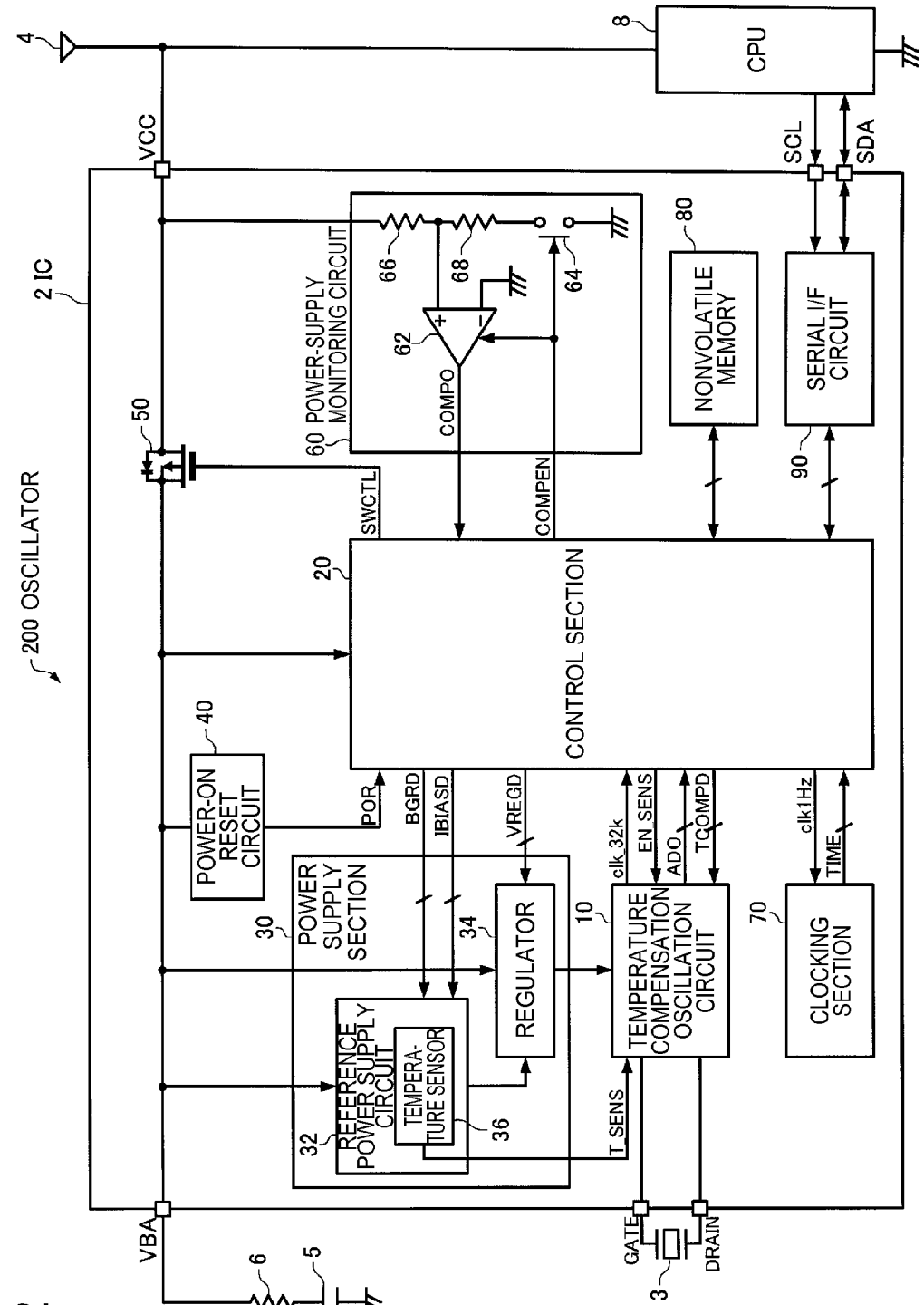
FIG. 12 is a diagram showing a configuration example of an oscillator in the embodiment.

FIG. 12 is a diagram showing a configuration example of an oscillator in this embodiment. In FIG. 12, components same as the components shown in FIG. 1 are denoted by the same reference numerals and signs. An oscillator 200 in this embodiment includes the resonator 3 and the oscillation circuit 2 that causes the resonator 3 to oscillate. The oscillator 200 in this embodiment may include the limiting resistor 6 and the backup power supply 5.

The configuration of the oscillation circuit 2 is the same as the configuration shown in FIG. 1. Therefore, explanation of the configuration is omitted. Note that, in the oscillation circuit 2, a part of the components shown in FIG. 12 may be omitted or changed or other components may be added.

With the oscillator 200 in this embodiment, it is possible to obtain effects same as the effects of the real time clock 1 in the embodiment.

3. Electronic Apparatus

Figure 13:
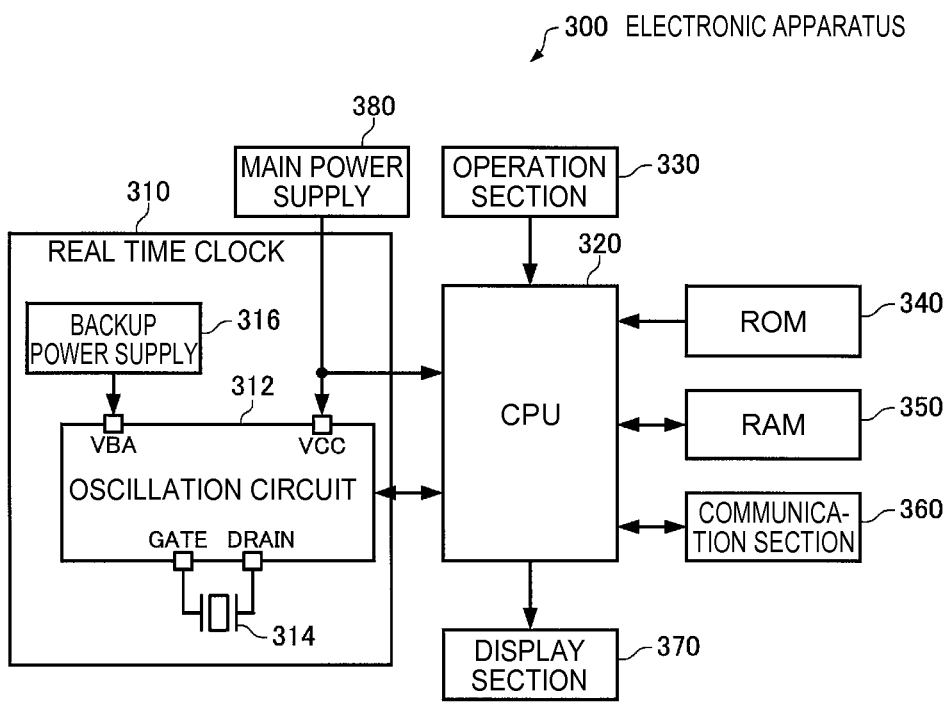
FIG. 13 is a functional block diagram of an electronic apparatus in the embodiment.
Figure 14:
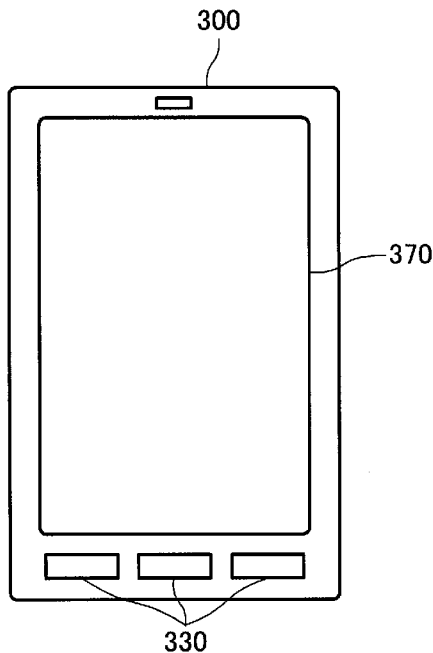
FIG. 14 is a diagram of an example of the external appearance of the electronic apparatus in the embodiment.

FIG. 13 is a functional block diagram of an electronic apparatus in this embodiment. FIG. 14 is a diagram showing an example of the external appearance of a smart phone, which is an example of the electronic apparatus in this embodiment.

An electronic apparatus 300 in this embodiment includes a real time clock 310, a CPU (Central Processing Unit) 320, an operation section 330, a ROM (Read Only Memory) 340, a RAM (Random Access Memory) 350, a communication section 360, a display section 370, and a main power supply 380. In the electronic apparatus in this embodiment, a part of the components (sections) shown in FIG. 13 may be omitted or changed or other components may be added.

The real time clock 310 includes an oscillation circuit 312 (an example of the circuit for oscillation), an resonator 314, and a backup power supply 316. The oscillation circuit 312 causes the resonator 314 to oscillate to generate a clock signal and generates time information on the basis of the clock signal. The backup power supply 316 supplies electric power to a VBA terminal of the oscillation circuit 312.

The main power supply 380 supplies electric power to a VCC terminal of the oscillation circuit 312. The main power supply 380 supplies electric power to the CPU 320 as well.

When the voltage at the VCC terminal is equal to or higher than a threshold voltage, the oscillation circuit 312 operates using the voltage at the VCC terminal as a power supply voltage. When the voltage at the VCC terminal is lower than the threshold voltage, the oscillation circuit 312 operates using the voltage at the VBA terminal as the power supply voltage.

The CPU 320 performs various kinds of calculation processing and control processing according to computer programs stored in the ROM 340 and the like. Specifically, the CPU 320 performs, for example, various kinds of setting processing for the oscillation circuit 312, processing for reading out the time information from the oscillation circuit 312, various kinds of processing corresponding to operation signals from the operation section 330, processing for controlling the communication section 360 in order to perform data communication with an external apparatus, and processing for transmitting a display signal for causing the display section 370 to display various kinds of information (the time information read out from the oscillation circuit 312, etc.).

The operation section 330 is an input device configured by operation keys, button switches, and the like. The operation section 330 outputs an operation signal corresponding to operation by a user to the CPU 320.

The ROM 340 has stored therein computer programs, data, and the like for the CPU 320 to perform the various kinds of calculation processing and control processing.

The RAM 350 is used as a work area of the CPU 320. The RAM 350 temporarily stores, for example, the computer programs and the data read out from the ROM 340, data input from the operation section 330, and results of calculations executed by the CPU 320 according to various computer programs.

The communication section 360 performs various kinds of control for establishing the data communication between the CPU 320 and the external apparatus.

The display section 370 is a display device configured by an LCD (Liquid Crystal display) or the like. The display section 370 displays various kinds of information on the basis of the display signal input from the CPU 320. A touch panel functioning as the operation section 330 may be provided in the display section 370.

It is possible to realize a highly reliable electronic apparatus by applying, for example, the real time clock 1 in the embodiment as the real time clock 310 or by applying, for example, the oscillation circuit 2 in the embodiment as the oscillation circuit 312. In the electronic apparatus 300 in this embodiment, an oscillator may be used instead of the real time clock 310. For example, the oscillator 200 in the embodiment can be applied as the oscillator.

Various electronic apparatuses are conceivable as the electronic apparatus 300. Examples of the electronic apparatus include personal computers (e.g., a mobile personal computer, a laptop personal computer, and a tablet personal computer), mobile terminals such as a smart phone and a cellular phone, a digital still camera, an inkjet-type discharge apparatus (e.g., an inkjet printer), storage area network devices such as a router and a switch, a local area network device, an apparatus for a mobile terminal base station, a television, a video camera, a video recorder, a car navigation apparatus, a real-time clock apparatus, a pager, an electronic notebook (including an electronic notebook with a communication function), an electronic dictionary, an electronic calculator, an electronic game machine, a controller for a game, a word processor, a work station, a video phone, a security television monitor, an electronic binocular, a POS terminal, medical apparatuses (e.g., an electronic thermometer, a sphygmomanometer, a blood sugar meter, an electrocardiogram apparatus, an ultrasonic diagnostic apparatus, and an electronic endoscope), a fish finder, various measuring apparatuses, meters (e.g., meters for a vehicle, an airplane, and a ship), a flight simulator, a head mounted display, motion trace, motion tracking, a motion controller, and PDR (pedestrian dead reckoning).

4. Moving Object

Figure 15:
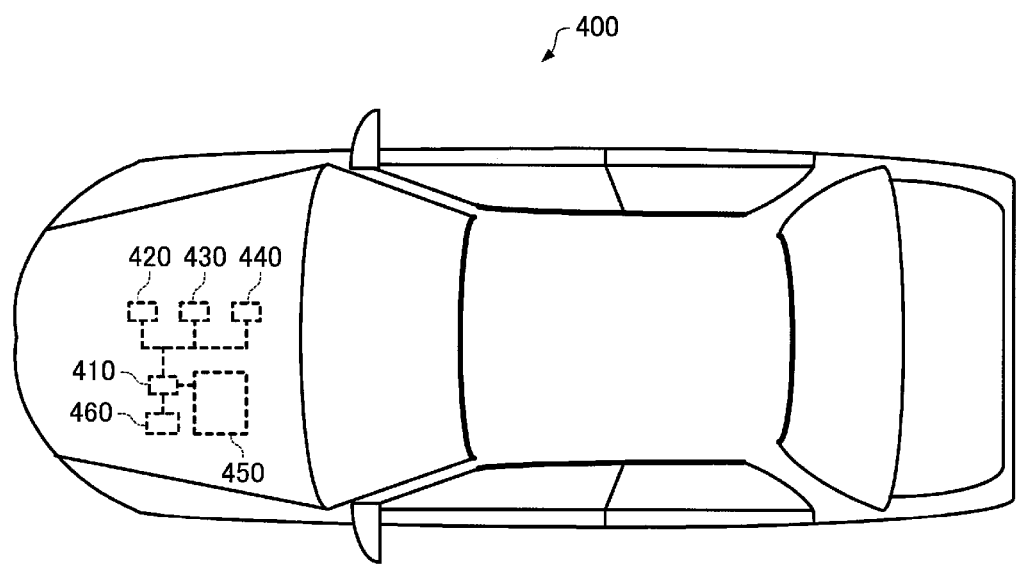
FIG. 15 is a diagram of an example of a moving object in the embodiment.

FIG. 15 is a diagram (a top view) showing an example of a moving object in this embodiment. A moving object 400 shown in FIG. 15 includes a real time clock 410, controllers 420, 430, and 440 that perform various kinds of control of an engine system, a brake system, and a keyless entry system, a battery 450, and a battery for backup 460. In the moving object in this embodiment, a part of the components (sections) shown in FIG. 15 may be omitted or other components may be added.

The real time clock 410 includes a not-shown oscillation circuit (an example of the circuit for oscillation). The battery 450 supplies electric power to a VCC terminal of the oscillation circuit. The battery for backup 460 supplies electric power to a VBA terminal of the oscillation circuit.

When the voltage at the VCC terminal is equal to or higher than a threshold voltage, the oscillation circuit outputs the voltage at the VCC terminal to a VOUT terminal. When the voltage at the VCC terminal is lower than the threshold voltage, the oscillation circuit outputs the voltage at the VBA terminal to the VOUT terminal.

Electric power is supplied to the controllers 420, 430, and 440 from a main power supply or a backup power supply via the VOUT terminal of the oscillation circuit.

It is possible to realize a highly reliable moving object by applying, for example, the real time clock 1 in the embodiment as the real time clock 410 or by applying, for example, the oscillation circuit 2 in the embodiment as the oscillation circuit. In the moving object 400 in this embodiment, an oscillator may be used instead of the real time clock 410. For example, the oscillator 200 in the embodiment can be applied as the oscillator.

Various moving objects are conceivable as the moving object 400. Examples of the moving object include an automobile (including an electronic vehicle), airplanes such as a jet airplane and a helicopter, a ship, a rocket, and an artificial satellite.

5. Modifications

The invention is not limited to the embodiment and various modified implementations are possible without departing from the spirit of the invention.

For example, in the embodiment, after the power-on of the oscillation circuit 2, the switch changeover operation is started when the count signal cnt[9:0] changes to 64. Thereafter, the temperature compensating operation is started when the count signal cnt[9:0] changes to 512. Therefore, after the start of the oscillation circuit 2, after the switch changeover operation is performed first, the temperature compensating operation is performed. However, the embodiment may be modified such that, after the temperature compensating operation is performed first, the switch changeover operation is performed.

The flowchart of FIG. 4 is changed to, for example, determine in step S18 whether the count signal cnt[9:0] is 100 or 512 and determine in step S24 whether the count signal cnt [9:0] is 164. Then, after the power-on of the oscillation circuit 2, the temperature compensating operation is started when the count signal cnt[9:0] changes to 100. Thereafter, the switch changeover operation is started when the count signal cnt[9: 0] changes to 164. That is, after the start of the oscillation circuit 2, after the temperature compensating operation is performed first, the switch changeover operation is performed.

Consequently, the output frequency of the temperature compensation oscillation circuit 10 is temperature-compensated before the switch changeover operation is performed. It is possible to reduce a start time required until the circuits such as the clocking section 70, which operates on the basis of the output signal of the temperature compensation oscillation circuit 10, are stabilizes.

For example, in the embodiment, the cycle of the temperature compensating operation and the refresh operation is fixed to 0.5 second. However, the cycle of the temperature compensating operation and the refresh operation may be able to be variably set by register setting or the like. Similarly, in the embodiment, the cycle of the switch changeover operation is fixed to 1 second. However, the cycle of the switch changeover operation may be able to be variably set by register setting or the like.

For example, in the embodiment, the time of one switch changeover operation is fixed to 2 ms. However, the time of the switch changeover operation may be able to be variably set by register setting or the like.

For example, the embodiment may be modified such that the oscillating section 12 of the temperature compensation oscillation circuit 10 includes a variable capacitance element (a variable capacitance diode) instead of the variable capacitance circuits 124 and 125 and the temperature compensating section 14 includes a circuit that generates an applied voltage to the variable capacitance element (the variable capacitance diode) according to the temperature detection signal T_SENS.

For example, the embodiment may be modified such that the temperature compensating operation includes an operation for writing the temperature compensation data in the nonvolatile memory 80. For example, the control section 20 may further perform (refresh) processing for writing the temperature compensation data TCOMPD read out from the nonvolatile memory 80 in the nonvolatile memory 80. For example, the control section 20 may calculate temperature compensation data corresponding to the A/D-converted data ADO and write the temperature compensation data in the nonvolatile memory 80.

For example, in the embodiment, the switch 50 and the power-supply monitoring circuit 60 select at least one of the main power supply 4 and the backup power supply 5 and control the power supply to the power supply section 30. However, the embodiment may be modified such that the switch 50 and the power-supply monitoring section 60 select at least one of three or more power supplies and control power supply to the power supply section 30.

In the embodiment, as an example of the "compensating section" according to the invention, the temperature compensating section 14 that performs the temperature compensating operation for the oscillating section 12 is explained. However, the "compensating section" according to the invention may perform a compensating operation other than the temperature compensating operation of the oscillating section 12 or may perform a compensating operation for circuits other than the oscillating section 12 (e.g., a compensating operation for the output voltage of the regulator 34).

This embodiment and the modifications explained above are examples. The invention is not limited to the embodiment and the modifications. For example, this embodiment and the modifications can also be combined as appropriate.

The invention includes components substantially the same as the components explained in the embodiment (e.g., components having the same functions, methods, and results or components having the same purposes and effects). The invention includes components in which non-essential portions of the components explained in the embodiment are replaced. The invention includes components that can realize action and effects or attain objects same as those of the components explained in the embodiment. The invention includes components in which publicly-known techniques are added to the components explained in the embodiment.

The entire disclosure of Japanese Patent Application No. 2013-165388, filed Aug. 8, 2013 is expressly incorporated by reference herein.

What is claimed is:

1. A circuit for oscillation comprising:
    a compensating section to which electric power is supplied from at least one power supply source among a plurality of power supply sources;
    an oscillating section, a function of which is compensated by a signal from the compensating section;
    a power-supply selecting section configured to select at least one of the plurality of power supply sources and perform an operation for controlling connection to the compensating section; and
    a control section configured to intermittently actuate the compensating section and the power-supply selecting section, wherein the control section periodically actuates the compensating section at a first predefined period and periodically actuates the power-supply selecting section at a second predefined period different from the first predefined period such that the compensation section and the power-supply selecting section are operated at different times.

2. The circuit for oscillation according to claim 1, wherein the power-supply selecting section operates after an operation of the compensating section is set.

3. The circuit for oscillation according to claim 2, further comprising a clocking section configured to generate time information on the basis of a signal output from the oscillating section, wherein
an operation of the clocking section for updating the time information and an operation of the power-supply selecting section do not overlap each other.

4. The circuit for oscillation according to claim 1, wherein the compensating section operates after the power-supply selecting section operates.

5. The circuit for oscillation according to claim 4, further comprising a clocking section configured to generate time information on the basis of a signal output from the oscillating section, wherein
an operation of the clocking section for updating the time information and an operation of the power-supply selecting section do not overlap each other.

6. The circuit for oscillation according to claim 1, further comprising a clocking section configured to generate time information on the basis of a signal output from the oscillating section, wherein
an operation of the clocking section for updating the time information and an operation of the power-supply selecting section do not overlap each other.

7. An oscillator comprising:
the circuit for oscillation according to claim 1; and
a resonator.

8. An electronic apparatus comprising the circuit for oscillation according to claim 1.

9. A moving object comprising the circuit for oscillation according to claim 1.

10. The circuit for oscillation according to claim 1 wherein the control section turns ON the compensation section after the power-supply setting section is turned-OFF and turns ON the power-supply setting section after the compensation section is turned-OFF.

11. The circuit for oscillation according to claim 1 wherein the compensation section outputs the signal to the oscillation section based on a signal from the control section.

12. The circuit for oscillation according to claim 1 wherein the first predefined period is shorter than the second predefined period such that the control section actuates the compensation section more often than the power-supply setting section.

13. A control method for an oscillation circuit including, an oscillating section to which a resonator is connected, a compensating section to which electric power is supplied from a first power supply source and a second power supply source, the compensating section compensating for a function of the oscillating section, and a power-supply switching section configured to control connection of the first power supply source and the compensating section,
the control method comprising:
intermittently actuating the compensating section at a first predefined period; and
intermittently actuating the power-supply switching section at a second predefined period different from the first predefined period such that an operation of the compensating section for setting a compensation amount and an operation of the power-supply switching section for controlling the connection do not overlap each other.

14. The control method for the oscillation circuit according to claim 13, wherein the operation for controlling the connection is performed after the operation for setting the compensation amount.

15. The control method for the oscillation circuit according to claim 13, wherein the operation for setting the compensation amount is performed after the operation for controlling the connection.

16. The control method for the oscillation circuit according to claim 13, wherein
the oscillation circuit further includes a clocking section configured to generate time information on the basis of a signal output from the oscillating section, and
an operation of the clocking section for updating the time information and the operation of the power-supply switching section for controlling the connection do not overlap each other.

17. The control method for the oscillation circuit according to claim 13, wherein the operation for controlling the connection includes an operation for switching, according to a result of comparing a voltage of the first power supply source with a threshold voltage, the power-supply selecting section to a state in which the power-supply selecting section selects the first power supply source or a state in which the power-supply selecting section selects the second power supply source.

18. The control method for the oscillation circuit according to claim 13, wherein
the oscillation circuit further includes a storing section in which compensation data for compensating for the oscillating section is stored, and
the operation for setting the compensation amount includes at least one of an operation for writing the compensation data in the storing section, an operation for reading out the compensation data from the storing section, and an operation for setting the oscillating section on the basis of the read-out compensation data.

* * * * *